United States Patent
Fujimoto

(10) Patent No.: US 6,683,514 B2
(45) Date of Patent: Jan. 27, 2004

(54) SWITCHED CAPACITOR CIRCUIT

(75) Inventor: Yoshihisa Fujimoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/207,177

(22) Filed: Jul. 30, 2002

(65) Prior Publication Data

US 2003/0020555 A1 Jan. 30, 2003

(30) Foreign Application Priority Data

Jul. 30, 2001 (JP) ........................................ 2001-230481

(51) Int. Cl.$^7$ ................................................ H03H 7/00
(52) U.S. Cl. ........................ 333/173; 333/184; 327/554; 327/565
(58) Field of Search ................................ 333/173, 184, 333/185; 327/337, 344, 554, 565

(56) References Cited

U.S. PATENT DOCUMENTS 4,920,325 A * 4/1990 Nicollini et al. ............. 333/173
6,437,608 B1 * 8/2002 Miyabe et al. ................. 327/96

OTHER PUBLICATIONS

"Analog MOS Integrated Circuits for Signal Processing", R. Gregorian, et al., published 1986, p. 513–524.

* cited by examiner

Primary Examiner—Tuan T. Lam
(74) Attorney, Agent, or Firm—Birch, Stewart, Kolasch & Birch, LLP.

(57) ABSTRACT

A non-inverting-side first switch is formed in a first area on one of sides of a differential amplifier, meanwhile a non-inverting-side second switch is formed in a second area on the other of sides of the differential amplifier, the non-inverting switches being for resetting a non-inverting input terminal of the differential amplifier. Similarly, An inverting-side first switch is formed in the first area, meanwhile an inverting-side second switch is formed in the second area, the inverting switches being for resetting a non-inverting input terminal of the differential amplifier. Further, a non-inverting-side line connecting the non-inverting-side first switch and the non-inverting input terminal, and an inverting-side line connecting the inverting-side first switch and the inverting-side second switch are provided next to each other. A signal line crossing one of the lines is provided so as to cross the other of the lines. This causes interferences from the signal line onto the lines to cancel out each other. As a result, it is possible to realize a switched capacitor circuit capable of attaining improvement in operational accuracy and low electric power consumption or high-speed operation.

13 Claims, 19 Drawing Sheets

SWITCHED CAPACITOR CIRCUIT

FIELD OF THE INVENTION

The present invention relates to a switched capacitor circuit including a differential amplifier, especially to a switched capacitor circuit for highly accurate operation, the switched capacitor circuit being capable of reducing electrical power consumption, or having high-speed performance.

BACKGROUND OF THE INVENTION

Recited in "Analog MOS Integrated Circuits for Signal Processing" (published 1986, pages 513 to 524) is an arranging method and layout method for each component of a switched capacitor circuit 501 shown in FIG. 17, in order to realize high noise tolerance and highly accurate signal operation.

Specifically, as shown in FIG. 18, the switched capacitor circuit 501 is provided with an area A503 between an area A501 and an area A504. In the area A501, a differential amplifier AMP501 is provided, while in the area A504, provided are clock lines for transmitting a clock signal φ. In the area A503, switches SW501 to SW503 are provided. Further, between the areas A503 and A501, arranged is an area A502 in which capacitors Cf501 and Cs501 are provided.

In the arrangement, the clock lines, which are noise sources that supply a significant amount of noise (clock noise), and the differential amplifier AMP501, which is susceptible to noise, are separated by the capacitors (Cs501 and Cf501) and the analog switches (SW501 to SW503) which are provided between the clock line and the differential amplifier AMP501. With this arrangement, it is possible to protect the differential amplifier AMP501 from the clock noise. Further, when another one or more switched capacitor circuits 501 are provided together with the switched capacitor circuit 501, it is possible to arrange the plurality of switched capacitor circuits 501 in a vertical direction (a direction that makes a right angle with a direction in which the areas A501 to area A504 are aligned). In this way, it is possible to lay out a circuit including the plurality of switched capacitor circuits 501 so that the circuit will be so compact.

Further, as shown in FIG. 19, the switched capacitor circuit 501, which is the prior art, is provided with the guard lines Lg501 that are maintained at a ground level. The guard lines Lg501 are provided so as to sandwich a line L501, which is arranged between an inverting input terminal T501m of the differential amplifier AMP501 and a switch SW501 for resetting the inverting input terminal T501m. This shields the line L501 from noise so as to prevent the switched capacitor circuit 501 from noise, thereby avoiding a significant reduction in operational accuracy of the switched capacitor circuit 501.

However, if only the layout method is applied, it is difficult to shield all the lines that may have high impedance. Thus, in this case, it is a problem that a switched capacitor circuit that operates in a sufficiently high accuracy is difficult to realize.

Moreover, it is difficult to have the guard lines Lg501 in at a gate of an input transistor of the differential amplifier AMP501, on a line in a vicinity of the gate, and in a connection part of an analog switch, and the like location. In addition, if shield layers are provided so as to sandwich a line connecting the inverting input terminal T501m and the switch SW501 in a perpendicular direction of a substrate (vertical direction), a new conductive layer is necessary for the shield layers, thereby increasing manufacturing cost of the switched capacitor circuit 501.

Furthermore, shielding both input terminals of the differential amplifier AMP501 increases parasite capacitance between (a) each of the input terminals and (b) ground, so that the parasite capacitance will have a value that is not negligibly low, compared with capacitance of a capacitor for operation, such as the capacitor Cs501 for input and the Cf501 for integral calculus. This may result in significant deterioration in settling characteristics. Especially, when the capacitance of the capacitor is reduced so as to attain a high-speed operation, there is a high possibility that the setting characteristics will be deteriorated. Thus, it is necessary that the capacitor for operation have a large capacitance. Thus, it is difficult to compatibly attain improvement in operational accuracy, and reduction in electrical power consumption or the high-speed performance.

SUMMARY OF THE INVENTION

The present invention has an object of realizing a switched capacitor circuit compatibly capable of improving operational accuracy, and of reducing electric power consumption or of attaining a high-speed operation.

A switched capacitor circuit of the present invention, in order to attain the object, is so arranged that a signal line crossing one of the lines connected to both input terminals of a differential amplifier is so positioned as to cross the other of the lines, wherein the lines are positioned next to each other to each other (i) from the respective input terminals to respective cross-points between the signal line and the lines, or (ii) from the respective input terminals to respective vicinities of the cross-points.

With the above arrangement, a signal line crossing a non-inverting-side line (hereinafter, the wording, "non-inverting-side" indicates that a component with the wording is provided on a non-inverting side with respect to the differential amplifier) crosses an inverting-side line (hereinafter, the wording "inverting-side" indicates that a component with the wording is provided on an inverting side with respect to the differential amplifier). Thus, an interference that is identical to an interference from the signal line onto the non-inverting-side line via a parasite capacitance is given to the inverting-side line from the signal line via a parasite capacitance. Therefore, the interferences are caused to cancel out each other by the differential operation of the differential amplifier. Thereby, it is possible to compatibly attain the improvement of the operational accuracy and the low electric power consumption or the high-speed operation.

A switched capacitor circuit of the present invention, in order to attain the above object, is so arranged that each of the non-inverting-side switch and the inverting-side switch is made of a pair of first and second switches connected to each other in parallel, wherein in one of the areas, which is a first area, the non-inverting-side first switch and the inverting-side first switch are provided, and in the other of the areas, which is a second area, the non-inverting-side second switch and the inverting-side second switch are provided.

With the above arrangement, the non-inverting-side and inverting-side switches can be positioned to be nearer to each other, compared with an arrangement in which the non-inverting-side switch is provided in one of the areas (for example, in the first area), and the inverting-side switch is provided in the other of the areas (for example, the second area). Therefore, it is possible to improve matching accuracies between the non-inverting-side and inverting-side first switches and between the non-inverting-side and inverting-side second switches. As a result, it is possible to cause clock noise entering the respective terminal to cancel out each other by the differential operation of the differential amplifier, thereby compatibly attaining the improvement in the operational accuracy and the low electric power consumption, or the high-speed operation.

A switched capacitor circuit of the present invention, in order to attain the above object, includes a signal line crossing one of the non-inverting-side line and the inverting-side line, which connect input terminals of the differential amplifier with switches respectively for resetting the input terminals, and an inverting signal line, crossing the one of the non-inverting-side line and the inverting-side line, for receiving an inverting signal of a signal to be transmitted via the signal line.

With the above arrangement, in which the inverting signal of the signal to be transmitted via the signal line is supplied to the inverting signal line, an effect given from the signal line onto the lines via the parasite capacitance and an effect given from the inverting signal line onto the lines via the parasite capacitance cancel out each other. Therefore, compared with an arrangement in which no inverting signal line is provided, it is possible to suppress the interference from the signal line onto the input terminals connected to the lines, thereby reducing an affect of the interference onto the operation of the switched capacitor circuit. This makes it possible to compatibly attain the improvement in the operational accuracy, and the low electric power consumption, or the high-speed operation.

A switched capacitor circuit of the present invention, in order to attain the above object, is so arranged that a signal line crossing one of the lines is so positioned as to cross the other of the lines, wherein (a) a portion of the non-inverting-side line from an end of the non-inverting-side second capacitor to a cross-point between the non-inverting-side line and the signal line or to a vicinity of the cross-point, and (b) a portion of the inverting-side line from an end of the inverting-side second capacitor to a cross-point between the inverting-side line and the signal line or to a vicinity of the cross-point, are positioned next to each other, wherein operation is carried out in accordance with the principle of conservation of charge in the both lines.

With the above arrangement, in which the signal line crossing the non-inverting-side line crosses the inverting-side line, the interference that is identical to the interference given from the signal line onto the non-inverting-side line via the parasite capacitance is given from the signal line onto the inverting-side line via the parasite capacitance. Thus, the interferences cancel each other by the differential amplifier of the differential amplifier. As a result, it is possible to compatibly attain the improvement in the operational accuracy and the low electric power consumption, or the high-speed operation.

A switched capacitor circuit of the present invention, in order to attain the above object, is so arranged that a non-inverting-side switch and an inverting-side switch, respectively connected to a non-inverting side line and an inverting side line, for resetting the non-inverting side line and the inverting side line, respectively, wherein each of the non-inverting-side switch and the inverting-side switch is made of a pair of first and second switches connected to each other in parallel, wherein in one of the areas, which is a first area, the non-inverting-side first switch and the inverting-side first switch are provided, and in the other of the areas, which is a second area, the non-inverting-side second switch and the inverting-side second switch are provided.

With the above arrangement, the matching accuracies between the first switches and between the second switches are respectively improved, so that effects of the clock noise applied onto the input terminals are cause to cancel out each other by the differential operation, similarly to the foregoing arrangement in which the non-inverting-side and the inverting-side lines are directly connected to the input terminals respectively. As a result, it is possible to compatibly attain the improvement in the operational accuracy and the low electric power consumption or the high-speed operation.

A switched capacitor circuit of the present invention, in order to attain the above object, includes (a) a signal line crossing one of a non-inverting-side line and an inverting-side line, the non-inverting-side line being connected to a non-inverting input terminal of the differential amplifier via a non-inverting-side second capacitor, and the inverting-side line being connected to an inverting input terminal of the differential amplifier via an inverting-side second capacitor, (b) an inverting signal line, crossing the one of the non-inverting-side line and the inverting-side line, for receiving an inverting signal of a signal to be transmitted via the signal line.

With the above arrangement, similarly to the foregoing arrangement in which the inverting signal line is provided, the effect given from the signal line onto the line via the parasite capacitance and the effect given from the inverting signal line onto the line via the parasite capacitance are caused to cancel out each other. As a result, it is possible to compatibly attain the improvement in the operational accuracy and the low electric power consumption or the high-speed operation.

For a fuller understanding of the nature and advantages of the invention, reference should be made to the ensuing detailed description taken in conjunction with the accompanying drawings.

DESCRIPTION OF THE EMBODIMENTS

[First Embodiment]

Explained below is an embodiment of the present invention, with reference to FIGS. 1 to 5. Specifically, a switched capacitor circuit 1 of the present embodiment is a switched capacitor circuit suitable for use in, for example, an analog circuit that is required to operate with high accuracy (for example, 10 bits or more) and at a high speed, such as 10 bit 20MS/s pipeline AD converter. As shown in FIG. 2, the switched capacitor circuit 1 is provided with (a) a differential amplifier AMP1 for differential input and differential output, (b) input capacitors Csp and Csm, (c) integral capacitors Cfp and Cfm, and (d) switches SW1p and SW1m to SW4p and SW4m. The (b) input capacitors Csp and Csm, (c) integral capacitors Cfp and Cfm, and (d) switches SW1p and SW1m to SW4p and SW4m are provided respectively associating with a non-inverting input terminal T1p and an inverting input terminal T1m of a differential amplifier AMP1. Those components are integrated on a substrate by CMOS process such as 0.35 μm rule.

Before explaining characteristic arrangement of the components and layout of the switched capacitor circuit 1 of the present embodiment, overall circuit arrangement and operation of the switched capacitor circuit 1 are explained below.

Figure 3:
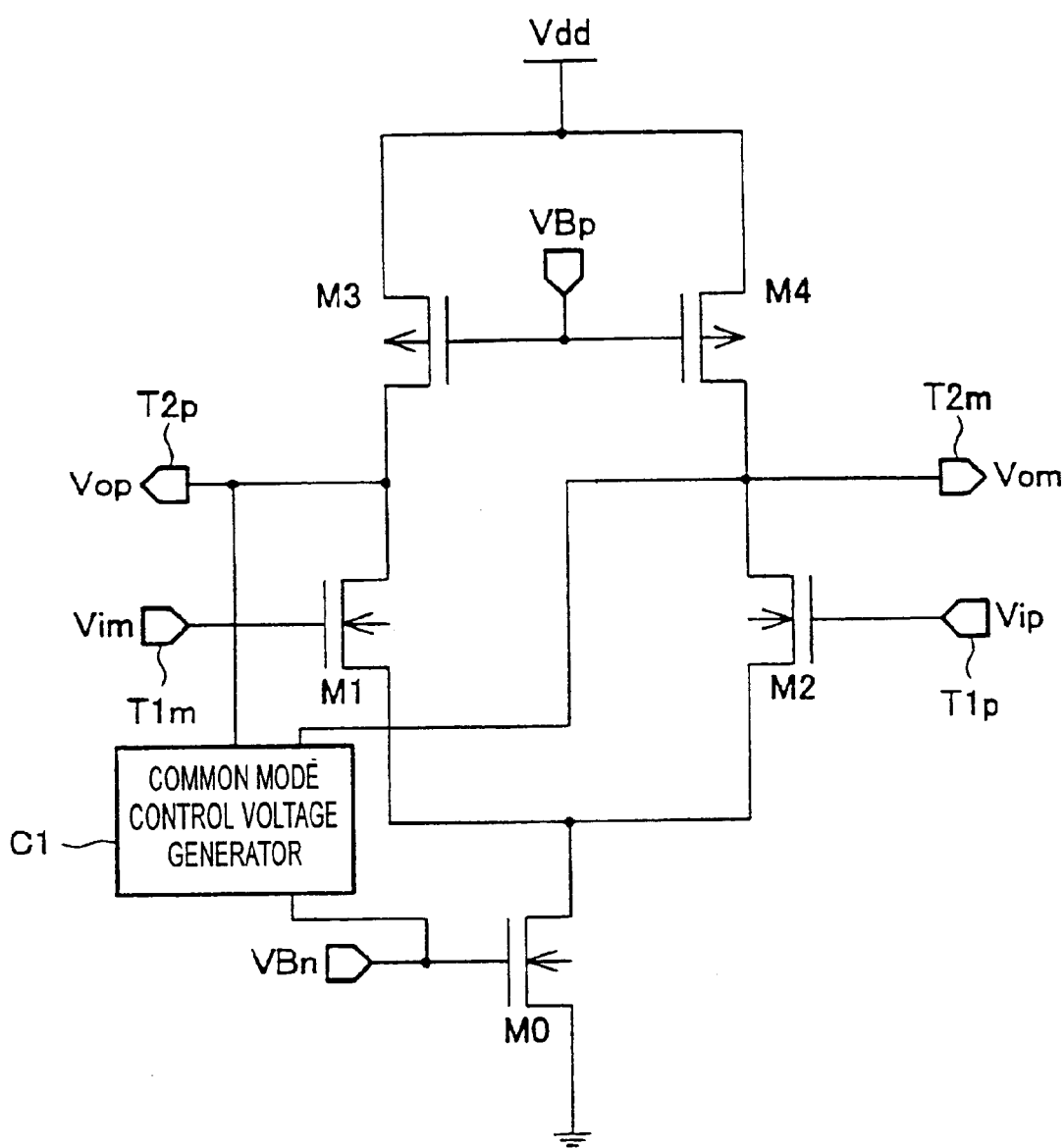
FIG. 3 is a circuit diagram illustrating an example of an arrangement of a differential amplifier provided in the switched capacitor circuit.

Specifically, the differential amplifier AMP1 is, as shown in FIG. 3 for example, is a differential amplifier provided with (a) transistors M0, M1 and M2, which are N-channel transistors, (b) transistors M3 and M4, which are P-channel transistors, and (c) a common mode control voltage generating circuit C1. The transistors M1 and M2 operate as a differential input pair (the transistors M1 and M2 operate in pair for differential input pair). Gates of the transistors M1 and M2 are respectively connected to the inverting input terminal T1m and the non-inverting input terminal Tip of the differential amplifier AMP1. Moreover, sources of both the transistors M1 and M2 are connected to each other, and grounded via the transistor M0. The transistor M0, whose gate receives a bias voltage VBn, operates as a constant current source. The bias voltage VBn is determined by output voltages Vop and Vom supplied from the common mode control voltage generating circuit C1.

Furthermore, drains of the transistors M1 and M2 are respectively connected to drains of transistors M3 and M4, which operate as active loads. The transistors M3 and M4, whose gate respectively receive a predetermined bias voltage VBp, are capable of supplying, respectively to the transistors M1 and M2, a constant current that is a half of the constant current supplied from the transistor M0. A power supply voltage Vdd is applied onto sources of the transistors M3 and M4. Further, a junction between the transistors M1 and M3 is connected to the non-inverting output terminal T2p of the differential amplifier AMP1, while a junction between the transistors M2 and M4 is connected to the inverting output terminal T2m. This allows the differential amplifier AMP1 to output, from the inverting output terminal T2m and the non-inverting output terminal T2p, an inverting output signal and a non-inverting output signal, whose levels are adjusted in accordance with a potential difference between the non-inverting input terminal T1p and the inverting input terminal T1m. Here, explained is the case where the differential amplifier AMP1 is the operational amplifier shown in FIG. 3, for easy explanation. However, the differential amplifier AMP1 may have another arrangement, such as an operational amplifier of cascode type and a multi-staged operational amplifier, in which a plurality of the operational amplifiers as shown in FIG. 3 are connected.

On the other hand, as shown in FIG. 2, one end of the integral capacitor Cfp is connected to the non-inverting input terminal T1p, and the other end of the integral capacitor Cfp is connected to the inverting output terminal T2m via the switch SW3p. Meanwhile, one end of the integral capacitor Cfm is connected to the inverting input terminal T1m, and the other end of the integral capacitor Cfp is connected to the non-inverting output terminal T2p via the switch SW3m. Moreover, the switch SW3p is switched, in accordance with a clock signal φ3, to one of the inverting output terminal T2m and the power supply terminal TP1, to which a reference voltage VCMO is supplied. The switch SW3p connects, to the integral capacitor Cfp, the one of the inverting output terminal T2m and the power supply terminal TP1. On the other hand, the switch SW3m is switched, in accordance with a clock signal φ3, to one of the non-inverting output terminal T2p and the power supply terminal TP1. The switch SW3m connects, to the integral capacitor Cfm, the one of the non-inverting output terminal T2p and the power supply terminal TP1.

Moreover, the inverting output terminal T2m and the non-inverting output terminal T2p are connected respectively to output terminals TOUTm and TOUTp of the switched capacitor circuit 1, and are connected to the power supply terminal TP1 respectively via the switches SW4p and SW4m, whose opening and closing are controlled in accordance with a clock signal φ4.

On the other hand, the non-inverting input terminal T1p and the inverting input terminal T1m are connected, respectively via the switches SW1p and SW1m, to a power supply terminal TP2, to which a reference voltage VCMI is supplied. Opening and closing of the switches SW1p and SW1m are controlled in accordance with the clock signal φ1.

Furthermore, one end of the input capacitor Csp is connected to the non-inverting input terminal T1p, while the other end of the input capacitor Csp is connected to an input terminal TINm of the switched capacitor circuit 1 via the switch SW2p. Meanwhile, one end of the input capacitor Csm is connected to the inverting input terminal T1m, while the other end of the input capacitor Csm is connected to an input terminal TINp of the switched capacitor circuit 1 via the switch SW2m. Moreover, the switch SW2p is switched, in accordance with a clock signal φ2, to one of the input terminal TINm and the power supply terminal TP3, to which a reference voltage VCMIN is supplied. The switch SW2p connects, to the input capacitor Csp, the one of the input terminal TINm and the power supply terminal TP3. On the other hand, the switch SW2m is switched, in accordance with a clock signal φ2, to one of the input terminal TINp and the power supply terminal TP3. The switch SW2m connects, to the input capacitor Csm, the one of the input terminal TINp and the power supply terminal TP3.

With the arrangement described above, the respective switches SW1p and SW1m to SW4p and SW4m are set in a manner shown in FIG. 2, during a sampling phase. In this manner, the switches SW1p and SW1m are closed. Thus, the reference voltage VCMI is supplied to both of the input terminals T1p and T1m of the differential amplifier AMP1, while accumulated electric charges, which are accumulated in the input terminals T1p and T1m for example by leakage current, are discharged, thereby resetting the input terminals T1p and T1m.

Further, when the respective switches SW1p and SW1m to SW4p and SW4m are set in this manner, the switches SW3p and SW3m are switched to the power supply terminal TP1, so that both ends of the respective integral capacitors Cfp and Cfm are supplied with the reference voltages VCMI and VCMO, which are respectively at the same level, thereby discharging the electric charge accumulated on the respective integral capacitors Cfp and Cfm.

Further, when the respective switches SW1p and SW1m to SW4p and SW4m are set in this manner, the switches SW1p and SW1m are closed while the switches SW2p and SW2m are switched to the input terminals TINm and TINp, respectively. Thus, an electric charge corresponding to a difference between the inverting input signal VINM and a reference voltage VCMI is accumulated in the input capacitor Csp, while an electric charge corresponding to a difference between the non-inverting input signal VINP and a reference voltage VCMI is accumulated in the input capacitor Csm. In addition, the switches SW4p and SW4m are closed.

When the sampling phase is to be ended, the switches SW1p and SW1m are opened, then, the switches SW4p and SW4m are opened. Further, the switches SW3p, SW3m, SW2p and SW2m are switched to select an alternative to that selected in the sampling phase. Thereby, the sampling phase is ended and is switched to a holding phase.

When the switches SW3p, SW3m, SW2p, and SW2m are switched over, the electric charge of the input terminal T1p and T1m are maintained. Therefore, voltages of the respective terminal TINp, TOUTp, TINm and TOUTm of the switched capacitor circuit 1, namely, voltages VINP, VOUTP, VINM, and VOUM, satisfy the following equations (1) and (2):

$$VINP \cdot C_{sm} = C_{fm} \cdot VOUTP \quad (1)$$

$$VINM \cdot C_{sp} = C_{fp} \cdot VOUTM \quad (2),$$

where each reference voltage (common mode voltage) VCMIN=VCMI=VCMO=0, ignoring the parasite capacitances to both the input terminals T1p and T1m. Where both of the capacitors $C_{sp}$ and $C_{sm}$ identically have a capacitance ($C_s$) and both of the integral capacitors $C_{fp}$ and $C_{fm}$ identically have a capacitance ($C_f$), the voltages VINP, VOUTP, VINM, and VOUM satisfy the following equation (3):

$$C_s \cdot (VINP - VINM) = C_f \cdot (VOUTP - VOUTM) \quad (3).$$

Therefore, where the parasite capacitances as to both the input terminals T1p and T1m are ignored, a calculation allows the switched capacitor circuit 1 to process a differential signal (in this case, to perform a sample holding process).

Further, in the present embodiment, each component and line in the switched capacitor circuit 1 is so arranged that the switched capacitor circuit 1 can perform without errors even if there is a parasite capacitance.

Figure 1:
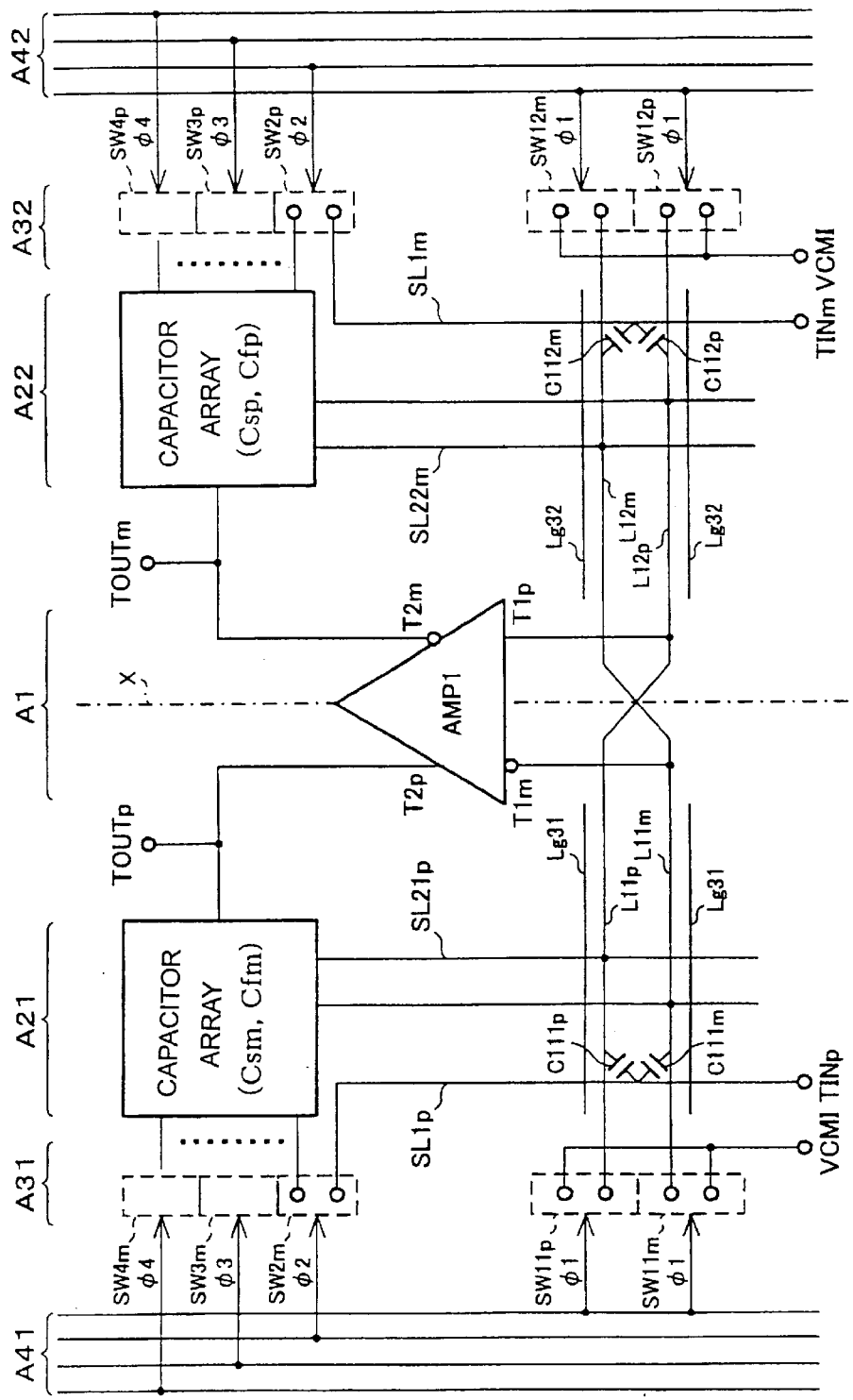
FIG. 1 is an explanatory view illustrating a layout of a switched capacitor circuit of an embodiment of the present invention.
Figure 2:
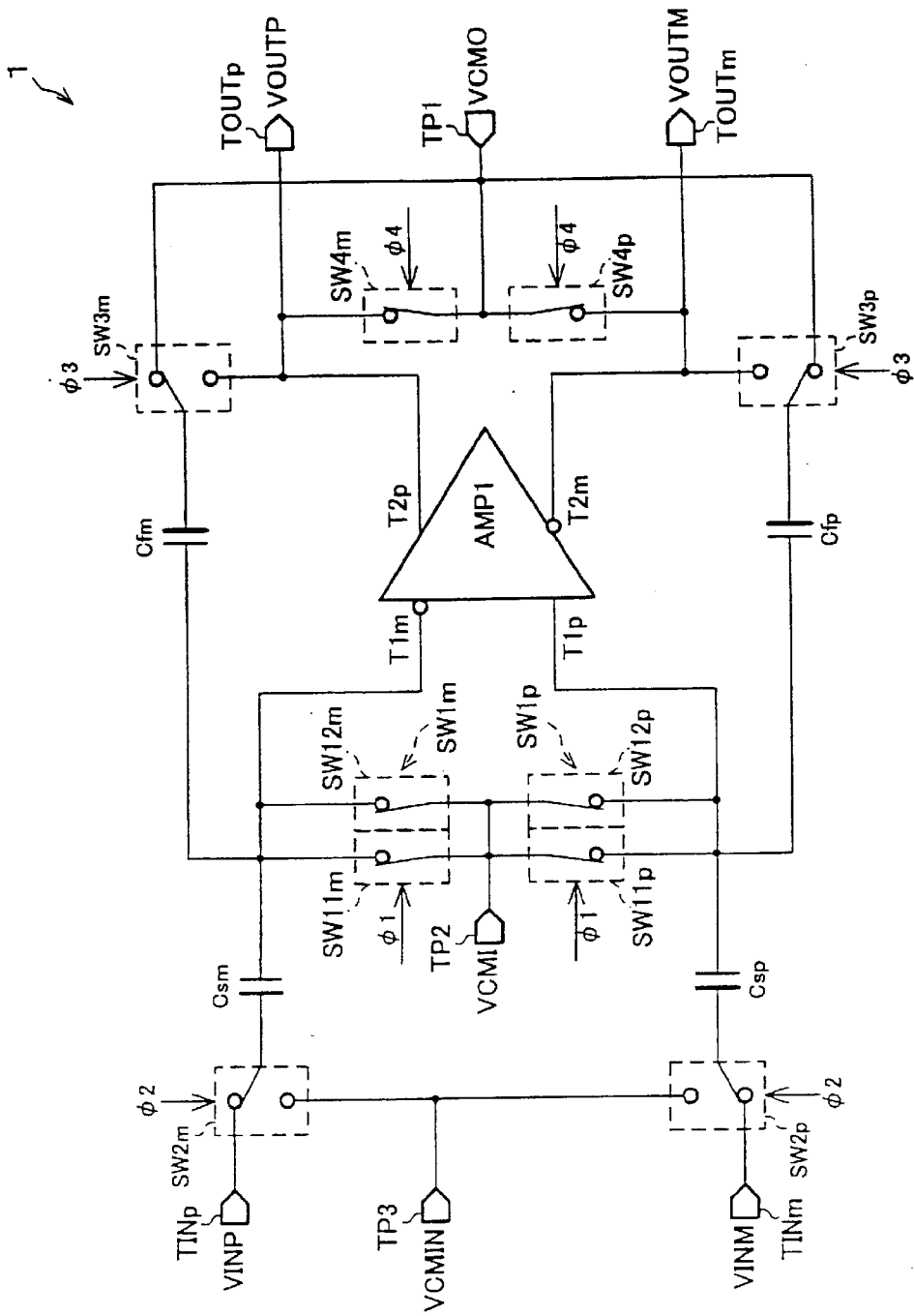
FIG. 2 is a circuit diagram illustrating the switched capacitor circuit.

Specifically, as shown in FIG. 1, for integrating the switched capacitor circuit 1, areas A21 and A22, in which capacitors are formed, are provided on both sides of an area A1, in which the differential amplifier AMP1 is formed. On both sides of the areas A21, A1, and A22, areas A31 and A32 are provided, in which switches are formed. Furthermore, on both sides of the areas A31, A21, A1, A22, and A32, areas A41 and A42 are provided, in which lines for the clock signals are formed.

In the present embodiment, provided in the area A21 are the capacitors Csm and Cfm, which are provided in relation to the inverting input terminal T1m of the differential amplifier AMP1. In the area A22, provided are the capacitors Csp and Cfp, which are provided in relation to the non-inverting input terminal T1p. Moreover, switches SW2m, SW3m, and SW4m are provided in the area A31, which locates on the side of the differential amplifier AMP1 on which the area A21 locates. Meanwhile, switches SW2p, SW3p, and SW4p are provided in the area A32, which locates on the side of the differential amplifier AMP1 on which the area A22 locates.

In the arrangement described above, the components Csp, Cfp, SW2p, SW3p, and SW4p are provided on the side on which the non-inverting input terminal T1p is located, meanwhile the components Csm, Cfm, SW2m, SW3, and SW4m are provided on the side on which the inverting input terminal T1m is located. Thus, the components Csp, Cfp, SW2p, SW3p, and SW4p are provided on the side opposite to the side the components Csm, Cfm, SW2m, SW3, and SW4m are provided. Therefore, the arrangement has a better prevention for the crossing of the lines connecting the respective components, compared with an arrangement in which the components relating to the input terminal T1p and those relating to the input terminal T1m are provided on the same side.

Additionally, in the present embodiment, as shown in FIG. 2, the SW1p, which resets the non-inverting input terminal T1p, is composed (made) of two switches SW11p and SW12p connected in parallel. The switch SW11p is formed in the area A31, while the switch SW12p is formed in the area A32. Similarly switch SW1m is composed of a switch SW11m in the area 31A and a switch SW12m in the area A32.

Further, the switches SW11m and SW12p are located (positioned) in line symmetry with respect to the differential amplifier AMP1. Similarly, the switches SW11p and SW12m are located in line symmetry with respect to the differential amplifier AMP1. Moreover, a line L11p, which is from the switch SW11p to the non-inverting inputted terminal T1p, is located next to a line L11m from the switch SW11m to the inverting input terminal T1m. Similarly, a line L12p, which is from the switch SW12p to the non-inverting inputted terminal T1p, is located next to a line L12m from the switch SW12m to the inverting input terminal T1m.

Moreover, in the present embodiment, the lines L11m and L11p (or L12m and L12p) are located in parallel and in vicinity with each other. For example, it is so arranged that a distance between the lines L11m and L11p (or L12m and L12p) be from 0.2 μm to 100 μm, approximately.

Further, the switched capacitor circuit 1 of the present embodiment is so arranged that the switched capacitor circuit 1 may be connected with other switched capacitor circuits 1 so that the plurality of switched circuits 1 are cascade-connected in multi-stages along a direction of a central axis X of the differential amplifier AMP1. Thus, a line that is from the area A21 (A22) for the capacitor via the output terminal TOUTp (TOUTm) to a next stage is extended to the next stage. Meanwhile, a line that is from the area A21 (A22) for the capacitor via the input terminal TINp (TINm) to a preceding stage is extended to the preceding stage.

Here, when the switches SW1p and SW1m, which reset both the input terminals T1p and T1m of the differential amplifier AMP1, are respectively provided on both sides of the amplifier AMP1 in such a manner that the switches SW1p and SW1m sandwich the central axis X, regardless of whether or not the switches SW1p and SW1m are divided into two, at least one of the lines (here, the lines SL1p and SL1m) connected to the next stage and the line connected to the preceding stage crosses at least one of a line between the switch SW1p and the non-inverting input terminal T1p and a line between the switch SW1m and the inverting input terminal T1m. At a junction thereof, a parasite capacitance is generated.

However, in the present embodiment, as described above, the switches SW1p and SW1m are provided on both the sides of the differential amplifier AMP1 in such a manner that the switches SW1p and SW1m sandwich the central axis X, and at least one of the line connected to the next stage and the line connected to the preceding stage (here, the lines SL1p and SL1m) crosses both (a) the line L11p or the line L12p, and (b) the line L11m or the line L12m, where the line L11p and line L12p are connected to the non-inverting input terminal T1p, while the line L11m and line L12m are connected to the inverting input terminal T1m.

With the arrangement described above, the signal line SL1p crosses the lines L11p and L11m so that parasite capacitances C111p and C111m are respectively formed. Meanwhile, the signal line SL1m crosses the lines L12p and L12m so that parasite capacitances C112p and C112m are respectively formed. Thus, drawing the parasite capacitances in the circuit diagram shown in FIG. 2 gives FIG. 4.

In the present embodiment, in which the lines L11p and L11m are located next to each other, the capacitance C111p between the signal line SL1p and the line L11p is, in terms of capacitance value, equal to the capacitance C111m between the signal line SL1p and the line L11m. As a result, an effect given by the signal to be transmitted through the signal line SL1p (that is, the non-inverting input signal VINP) onto the non-inverting input terminal T1p of the differential amplifier AMP1 via the line L11p become equal to an effect given by the signal onto the inverting input terminal T1m of the differential amplifier AMP1 via the line L11m. Similarly, the parasite capacitance C112p and the parasite capacitance C112m have the same capacitance. Thereby, the effects given by the signal (VINM) to be transmitted via the signal line SL1m onto the respective input terminals T1p and T1m become equal to each other.

Specifically, when the parasite capacitances are taken into consideration, the above-mentioned Equations (1), (2) are rewritten as Equations (4) and (5) as follows:

$$C111m \cdot VINP + C112m \cdot VINM + Csm \cdot VINP = Cfm \cdot VOUTP + C111m \cdot VINP2 + C112m \cdot VINM2 \quad (4),$$

$$C111p \cdot VINP + C112p \cdot VINM + Csp \cdot VINM = Cfp \cdot VOUTM + C111p \cdot VINP2 + C112p \cdot VINM2 \quad (5).$$

Note that in Equations (4) and (5) VINP2 and VINM2 are voltages of the input terminals TINp and TINm in the hold phase after the switches SW1p and SW1m are opened.

Here, the parasite capacitances C111p and C111m are equal to each other, and the parasite capacitances C112p and C112m are equal to each other, as described above. Therefore, by subtracting Equation (5) from Equation (4), a relational expression of input and output of the switched capacitor circuit 1 are derived as shown in Equation (6) below:

$$Cs \cdot (VINP - VINM) = Cf \cdot (VOUTP - VOUTM) \quad (6).$$

Thus, the parasite capacitances give no effect on an operation result (differential signal operation).

Note that the forgoing description is explained referring to the signal lines SL1p and SL1m as an example. However, in the present embodiment, other signal lines, such as signal lines connected to both the output terminals TOUTp and TOUTm of the switched capacitor circuit 1, is arranged such that they cross both the lines L11p and L11m if they cross one of the lines L11p and L11m without being electrically connected thereto. Similarly, a signal line, which crosses one of the line L12p and L12m, is arranged to cross the other of the line L12p and L12m. This arrangement causes the parasite capacitance applied onto one of the input terminals T1p and T1m is equal to that applied onto the other of the input terminals T1p and T1m. As a result, similarly to the above, it is possible to suppress operational errors caused by the parasite capacitance.

Moreover, in the present embodiment, a signal line that is electrically connected to one of the lines L11p and L11m, for example the line SL21p connecting the capacitor Cfm and the line L11p, the capacitor Cfm being provided in the area A21 of the capacitor, are arranged such that they cross the other of the lines L11p and L11m. Further, in the present embodiment, the line L11p outgoing to the switch SW11p and the line L12m outgoing to the switch SW12m are positioned so as to be in line symmetry with respect to the central axis X. Further, (a) the components, such as the capacitor Cfp, which are provided on one side of the central axis X and in relation to (associated with) the non-inverting input terminal T1p, and (b) the components, such as the capacitor Cfm, which are provided on the other side of the central axis X and in relation to the inverting input terminal T1m, are provided in the line symmetry with respect to the central axis X. Moreover, a line connecting the respective components provided on the one side of the central axis X to the respective lines L11p and L11m are located in the line symmetry with respect to the central axis X with a line connecting the respective components provided on the other side of the central axis to the respective lines L12m and L12p. As a result, even the signal lines electrically connected to any one of the respective lines L11p to L12m can give the same amount of effects onto the respective input terminals T1p and T1m of the differential amplifier AMP1, thereby canceling out the interferences from the signal lines by operation of the differential amplifier AMP1.

Additionally in the present embodiment, the lines L11p and L11m are positioned in parallel and in vicinity of each other (for example, 0.2 μm to 100 μm in case of 0.35 μm rule). Moreover, the lines L12p and L12m are also positioned in parallel and in vicinity of each other. Therefore, compared with the case where the respective lines L11p and L11m and the respective lines L12p and L12m are not in vicinity with each other, it is possible to suppress effects, such as radiated noise, which enters each of the lines L11p, L11m, L12p and L12m. Moreover, it is possible to suppress unevenness between the parasite capacitances, which is caused by unevenness in quality of materials or unevenness in shapes (such as line widths). Moreover, because the respective lines are positioned in parallel, it is possible to limit the unevenness in the parasite capacitance caused by the unevenness in shapes (such as line widths), compared with the case where the lines are not in parallel. Furthermore, the lines L11$p$ and L11$m$ are closely located in parallel to each other, meanwhile the lines L11$p$ and L11$m$ are closely located in parallel to each other. This reduces effects of noise that travels through the substrate in case of the CMOS process.

Moreover, in the present embodiment, the analog switch (SW1$p$) for resetting the non-inverting terminal T1$p$ of the differential amplifier AMP1 is divided into two switches SW11$p$ and SW12$p$, so that the switches SW11$p$ and SW12$p$ are respectively provided in the areas A31 and A32 provided on both the sides of the differential amplifier AMP1. Similarly, the switch SW1$m$ for resetting the non-inverting terminal T1$m$ is divided into the switches SW11$m$ and SW12$m$, so that the switches SW11$m$ and SW12$m$ are respectively provided in the areas A31 and A32. Therefore, it is possible to have a shorter distance between the switches SW11$p$ and SW11$m$, compared to a case where the switch SW1$p$ is provided in one of the areas A31 and A32, and the switch SW1$m$ is provided in the other. Thus, it is possible to arranged such that the noise (such as charge-injection and clock-field-through) entering the input terminal T1$p$ via the switch SW1$p$ is equal to that entering the input terminal T1$m$ via the switch SW11$m$. Similarly, it is possible to arrange such that the noise entering the input terminal T1$p$ via the switch SW12$p$ is equal to that entering the input terminal T1$m$ via the switch SW12$m$. As a result, the differential operation of the switched amplifier AMP1 causes the noise to cancel each other, thereby reducing operational errors of the switched capacitor circuit 1.

Especially, in the present embodiment, the switches SW11$p$ and SW11$m$, which are provided in the area A31, are provided in vicinity to each other, for example, so that diffusion areas of the switches SW11$p$ and SW11$m$ are overlapped, and the switches SW12$p$ and SW12$m$, which are provided in the area A31, are provided in vicinity to each other, for example, so as to overlap their diffusion areas. Moreover, even if provided so that the diffusion areas are not overlapped, the switches SW11$p$ and SW11$m$ are provided in vicinity to each other in a distance ranging from 0.1 $\mu$m to 20 $\mu$m, and so are the switches SW12$p$ and SW12$m$. By arranging in this way, it is possible to improve matching accuracy between the switches SW11$p$ and SW11$m$, and that between the switches SW12$p$ and SW12$m$. Thereby, it is possible to reduce the operational errors of the switched capacitor circuit 1.

Additionally, the switched capacitor circuit 1 of the present embodiment is provided with guard lines Lg31, to which a stable potential, such as a ground potential, is applied. The guard lines Lg31 are provided so that the guard lines Lg31 sandwich the lines L11$p$ and L11$m$. Similarly, guard lines Lg32 are provided so that the guard lines Lg32 sandwich the lines 12$p$ and L12$m$. This arrangement causes the lines L11$p$, L11$m$, L12$p$, and L12$m$ to have high impedances. Further, it is possible to protect the lines L11$p$ to L12$m$ from the interference of the noise. If entered by the noise, the lines L11$p$ to L12$m$ affect the result of the operation of the switched capacitor circuit 1. With this arrangement, it is therefore possible to reduce the operational errors of the switched capacitor circuit 1.

Note that FIG. 1 illustrates that a line is extended from the line L11$p$ or L12$p$ to the non-inverting input terminal T1$p$, and a line is extended from the line L11$m$ or L12$m$ to the inverting input terminal T1$m$. However, it is possible to connect each of the input terminals T1$p$ and T1$m$ respectively to the lines L11$p$ and L11$p$, or the lines L11$m$ and L12$m$ even if no line is extended therebetween, for example, with such arrangement that the differential input pair (the transistors M1 and M2 of FIG. 3) of the differential amplifier AMP1 are positioned to have a common centroid geometry, and each component are positioned so that a border between the transistors M1 and M2 are between the line L11$m$ (or L12$m$) and the line L11$p$ (or L12$p$).

Moreover, in this case, it may be so arranged that the transistor M1 is composed of two transistors M11 and M12 in parallel to each other, while the transistor M2 is similarly composed of two transistors M21 and M22, again, in parallel to each other, in such a manner that the transistors M11 and M21 are positioned in line symmetry with each other and the transistors M12 and M22 are positioned in line symmetry with each other, with respect to the central axis X (in case there are a plurality of central axes, the axis perpendicular to the line L11$m$) of the differential amplifier AMP1. In this manner, it is possible to have such arrangement that (a) the line from the line L11$p$ to the line L12$p$ and (b) the line from the line L11$m$ to the line L12$m$ cross each other in an area between the transistors M11 and M12, that is, between the transistors M21 and M22, so that the lines will exchange their positions.

Note that the lines are arranged next to each other (a) in the whole lengths of the lines L11$p$ and L12$p$, that is, the lengths from the non-inverting input terminal T1$p$ to the switch SW11$p$ (not including the switch SW11P), and (b) in the whole lengths of the lines L11$m$ and L12$m$. However, it is possible to have a substantially similar effect, for example, by having arranging the lines next to each other until cross-points between the lines and a noise-generating signal line such as the signal lines connected to the terminals TINp, TINm, TOUTp, and TOUTm, or until vicinities (within 10 $\mu$m approximately) of the cross points. However, the operational accuracy of the switched capacitor circuit 1 can be further improved by arranging the lines next to each other in longest lengths possible, that is, in the whole lengths of the lines, as the present embodiment.

Moreover, explained above is the case where no offset compensation is carried out. However, even if the offset compensation is carried out, the similar effect is obtained by arranging, in the similar manner to the present embodiment, the switches SW1$p$ and SW1$m$, the lines L11$p$ to L12$m$ connected respectively to the switches SW1$p$ and SW1$m$, and the signal line crossing each line.

More specifically, a switched capacitor circuit 1$a$ of a present modification has a substantially similar arrangement to that of FIG. 2, except that a switch SW1$p$ for resetting a non-inverting input terminal T1$p$ is provided between the non-inverting input terminal T1$p$ and an inverting output terminal T2$m$, and a switch SW1$m$ for resetting an inverting input terminal T1$m$ is provided between the inverting input terminal T1$m$ and a non-inverting output terminal T2$p$. Moreover, no switches SW4$p$ and SW4$m$, and no power terminal TP2 are provided in the switched capacitor circuit 1$a$.

Figure 5:
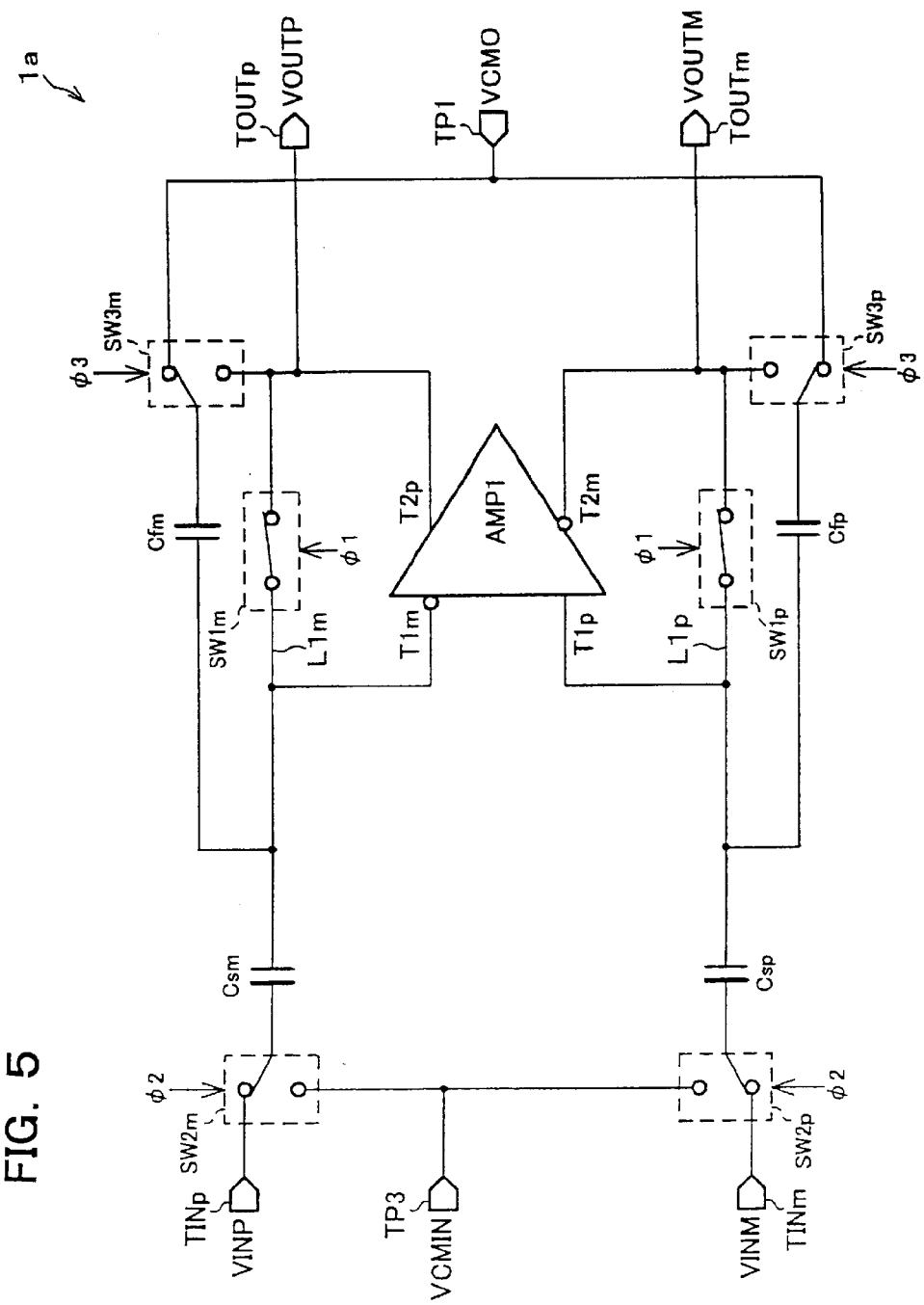
FIG. 5 is a circuit diagram illustrating modification of the switched capacitor circuit.

In the arrangement described above, respective switches SW1$p$ and SW1$m$ to SW3$p$ and SW3$m$ are in a state shown in FIG. 5. In this state, the switches SW1$p$ and SW1$m$ are respectively closed. Therefore, an electric charge that is accumulated in the non-inverting input terminal T1$p$ of a differential amplifier AMP1 is discharged via the inverting output terminal T2$m$, so that a potential of the terminal T1$p$ is reset to a potential Vxp of a case where the input and output terminals T1p and T2m are short-circuited. Similarly, an electric charge accumulated in the inverting input terminal T1m is discharged via the non-inverting output terminal T2p, so that a potential of the terminal T1m is reset to a potential Vxm of a case where the input and output terminals T1m and T2p are short-circuited.

Here, the input and output terminals T1p and T2m are short-circuited, and the input and output terminals T1m and T2p are short-circuited as well. Therefore, the potentials Vxp and Vxm respectively satisfy the following Equations (7) and (8):

$$Vxp=A/(A+1) \cdot Vofsp \qquad (7),$$

$$Vxm=A/(A+1) \cdot Vofsm \qquad (8),$$

where Vofsp and Vofsm are respectively offset voltages respectively appeared on the input and output terminals T1m and T1p of the differential amplifier AMP1, and A is a gain.

Further, when in this state, the switch SW2p selects an inverting input terminal TINm of the switched capacitor circuit 1a, while the switch SW3p selects so as to let a reference voltage VCMP pass through. Thus, in an input capacitor Csp, accumulated is an electric charge in accordance with an input voltage VINM and the potential Vxp, while an electric charge in accordance with a difference between the potential Vxp and the reference voltage VCMO is accumulated in an integral capacitor Cfp. Similarly, the switch SW2m selects the non-inverting input terminal TINp of the switched capacitor circuit 1a, while the switch SW3m selects so as to let the reference voltage VCMO pass through. Thereby, an electric charge in accordance with the potential Vxm is accumulated in an input capacitor Csm and an electric charge in accordance with a difference between the potential Vxm and the reference voltage VCMO is accumulated in an integral capacitor Cfm.

When a sampling phase is to be ended, the switches SW1p and SW1m are opened. Further, the switches SW3p, SW3m, SW2p and SW2m select an alternative to that is selected in the sampling phase. In this way, the sampling phase is ended and it turns to a hold phase.

Here, when switching over the switches SW3p, SW3m, SW2p and SW2m, the electric charges of both the input terminals T1p an T1m are maintained because the switches SW1p and SW1m are opened.

Therefore, an electric charge Q accumulated in both the capacitors Csp an Cfd in the sampling phase and the hold phase satisfy the following Equations (9) and (10):

$$Q=Csp \cdot (VINM-Vxp)+Cfp \cdot (-Vxp) \qquad (9),$$

$$Q=Csp \cdot (-Vx2p)+Cfm \cdot (VOUTP-Vx2p) \qquad (10),$$

where Vx2p of Equation (10) is an input voltage of the non-inverting input terminal T1p in the hold phase, Vs2p satisfying Equation (11):

$$-A \cdot (Vx2p-Vofsp)=VOUTM \qquad (11).$$

Further, assuming that the gain A of the differential amplifier AMP1 is sufficiently large, and summing up the Equations (7) and (9) to (11), input and output voltages VINM and VOUTM of the switched capacitor circuit 1a satisfy Equation (12) shown below:

$$VOUTM=(Csp/Cfp) \cdot VINM \qquad (12),$$

where the parasite capacitances respectively applied onto the input terminals are ignored.

Similarly, assuming the gain A of the differential amplifier AMP1 is sufficiently large, input and output voltages VINP and VOUTP of the switches SW1 satisfy Equation (13) shown below:

$$VOUTP=(Csm/Cfm) \cdot VINP \qquad (13),$$

where both the parasite capacitances are ignored.

As a result, input and voltage voltages of the switched capacitor circuit 1a satisfy Equation (14) shown below:

$$Cs \cdot (VINP-VINM)=Cf \cdot (VOUTP-VOUTM) \qquad (14).$$

Even if the offset voltages Vofsp and Vofsm are generated in the differential amplifier AMP1, the switched capacitor circuit 1a can outputs a correct value in which effects of the offsets voltages are compensated, by ignoring the parasite capacitances respectively applied on the input terminals T1p and T1m.

Again in this case, it is possible to obtain a similar effect by having a similar arrangement to the present embodiment, that is, by arranging the switches SW11p to SW12m for resetting the input terminals T1p and T1m, the lines L11p to L12m connected to the respective switches, and the signal lines SL1p and SL1m crossing each line as shown in FIG. 1. Described in the present embodiment is the sample hold amplifier circuit. However, the present embodiment may be adapted to an integrator of the sample hold type.

[Second Embodiment]

The first embodiment is explained, discussing the switched capacitor circuit 1 of the differential input/differential output type. On the other hand, the present embodiment is explained, discussing a switched capacitor 1 of the single-ended input/single-ended output, with reference to FIGS. 6 and 8.

Figure 6:
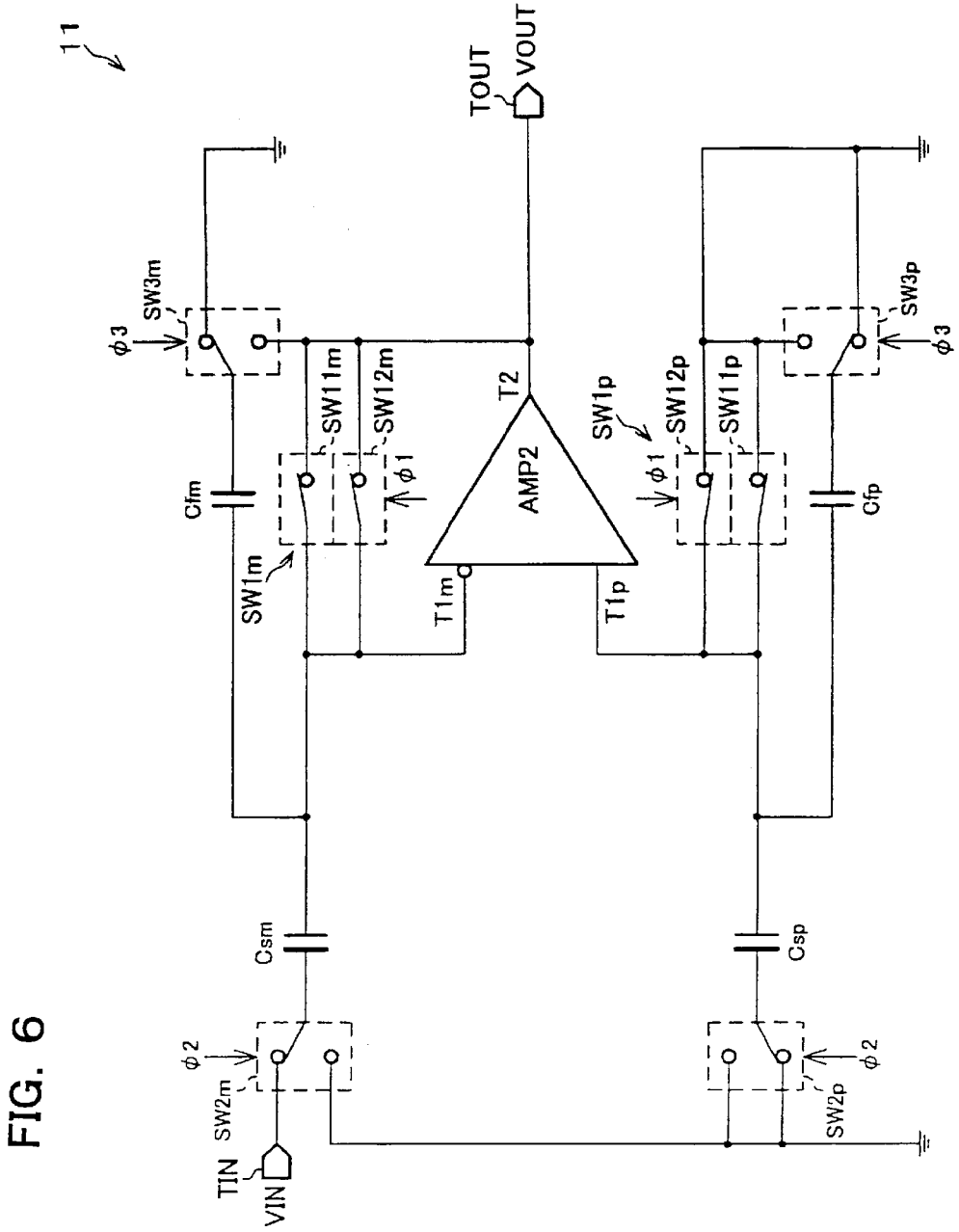
FIG. 6 is a circuit diagram of a switched capacitor circuit of another embodiment of the present invention.

Specifically, a switched capacitor circuit 11 of the present embodiment, which is a switched capacitor circuit for performing offset compensation, has an arrangement substantially similar to that of the switched capacitor circuit 1a of FIG. 5, as shown in FIG. 6. However, the switched capacitor circuit 11 of the present embodiment, which is of the single-ended input/output, is provided without the input terminal TINm and output terminal TOUTm. Moreover, the switched capacitor circuit 11 is provided with an input terminal TIN instead of the input terminal TINp, and an output terminal TOUT instead of the output terminal TOUTp. Note that in the switched capacitor circuit 11, the power supply terminals TP1 and TP3 are also omitted, and components connected to the power supply terminals TP1 and TP3 are grounded.

Figure 7:
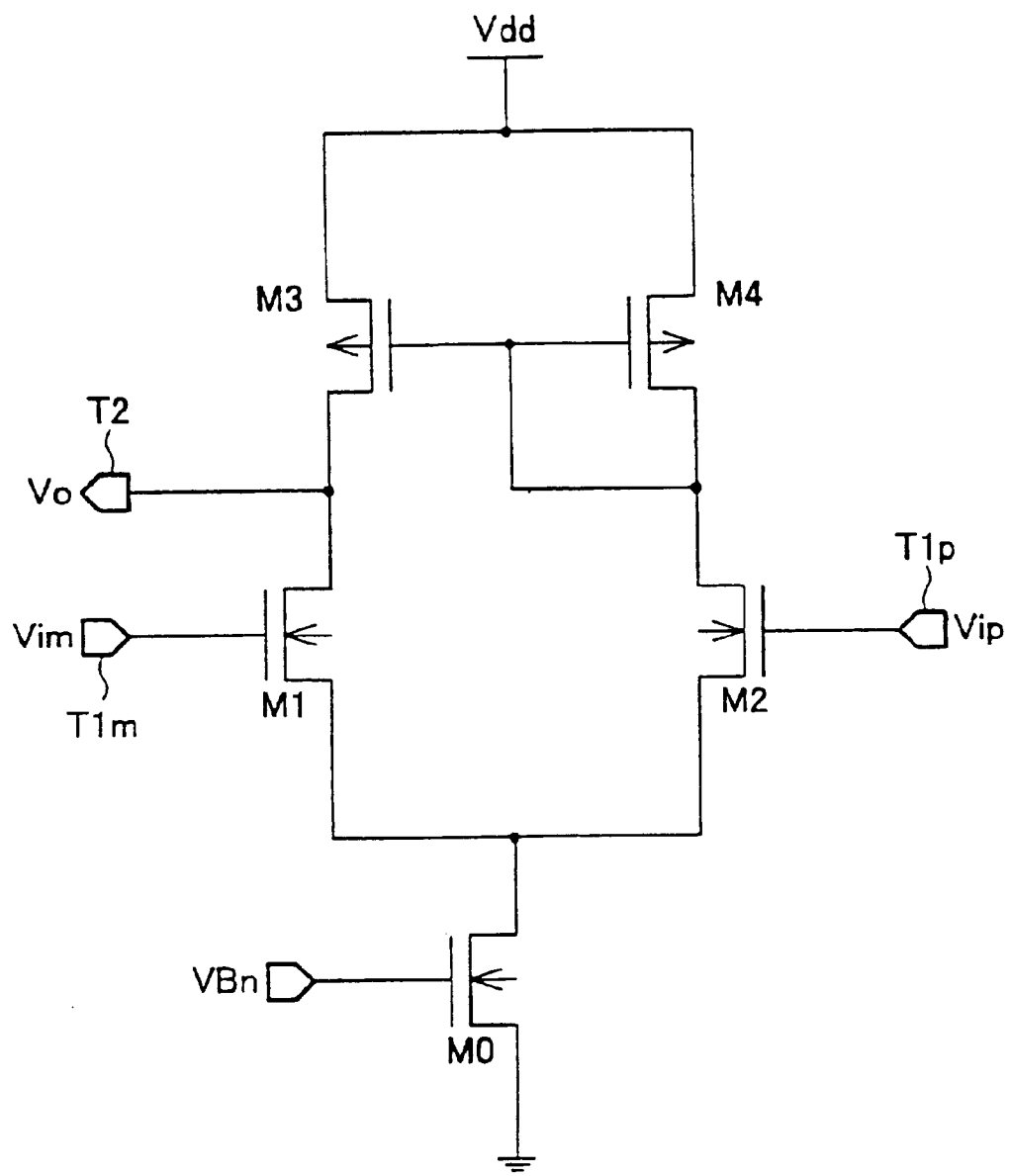
FIG. 7 is a circuit diagram showing an example of an arrangement of a differential amplifier provided in the switched capacitor circuit.

Further, the switched capacitor circuit 11 is provided with a differential amplifier AMP2 of the differential input and the single ended output, instead of the differential amplifier AMP1 shown in FIG. 5. The differential amplifier AMP2 is, for example, provided with transistors M0 to M5 connected in a substantially similar manner to that of FIG. 3, as shown in FIG. 7, except that only a node between the transistors M3 and M1 is connected to an output terminal T2, because the differential amplifier AMP2 is of single-ended output. Moreover, both gates of the transistors M3 and M4 are connected to a drain of the transistor M4, instead of being arranged such that the predetermined bias voltage VBp is applied onto the gates. With this arrangement, the differential amplifier AMP2 can output, from an output terminal T2, an output signal of a level according to a potential difference between a non-inverting input terminal T1p and an inverting input terminal T1m. Here, explained is the case where the differential amplifier AMP2 is the operational amplifier shown in FIG. 7, for easy explanation. However, the differential amplifier AMP2 may have another arrangement, such as an operational amplifier of cascode type and a multi-staged operational amplifier, in which a plurality of the operational amplifiers as shown in FIG. 7 are connected.

Further, in the present embodiment, a switch SW1m is provided between the inverting input terminal T1m and the output terminal T2. Among three terminals of a switch SW3m, one of the terminals that are not connected to an integral capacitor Cfm is connected to the output terminal TOUT of the differential amplifier AMP2, and the other is grounded. Moreover, among three terminals, one of the terminals that are not connected to an input capacitor Csm is connected to the input terminal TIN of the switched capacitor circuit 11, and the other is grounded.

On the other hand, the non-inverting input terminal T1p of the differential amplifier AMP2 is grounded via a switch SW1p. Among three terminal of a switch SW3p, both the terminals that are not connected to an integral capacitor Cfp are respectively grounded. Moreover, among three terminals of a switch SW2p, both the terminals that are not connected to an input capacitor Csp are respectively grounded.

With the arrangement, the respective switches SW1p and SW1m to SW3p and SW3m are in a state shown in FIG. 6. In this state, the switch SW1p is closed so that the non-inverting input terminal T1p of the differential amplifier AMP2 is grounded. The closing of the switch SW1p discharges an electric charge accumulated in the terminal T1p, thereby resetting the terminal T1p. Moreover, because the switch SW1m is closed, an electric charge accumulated in the inverting input terminal T1m of the differential amplifier AMP2 is discharged via the output terminal T2, thereby resetting a potential of the terminal T1m to a voltage Vx of a case where the input and output terminals T1m and T2 are short-circuited. Note that because the input and output terminals T1m and T2 are short-circuited, the voltage Vx satisfies Equation (15) shown below:

$$Vx=A/(A+1)\cdot Vofs \tag{15}$$

where Vofs is the offset voltage of the differential amplifier AMP2 and A is a gain.

Further, in this state, the switch SW2m selects the input terminal TIN of the switched capacitor circuit 11, and the switch SW3m selects the ground. Therefore, in the input capacitor Csm, accumulated is an electric charge in accordance with a difference between an input voltage and the voltage Vx, while in the integral capacitor Csf, an electric charge in accordance with the voltage Vx is accumulated. The switches SW2p and SW3p select the ground, and the switch SW1p is closed. Thus, respectively in the input capacitor Csp and the integral capacitor Cfp, potentials on both ends are equal to each other, so that no electric charge will be accumulated in the input capacitor Csp and the integral capacitor Cfp.

When a sampling phase is to be ended, the switches SW1p an SW1m are opened. Further, the switches SW3p, SW3m, SW2p and SW2m select an alternative to that is selected in the sampling phase. In this way, the sampling phase is ended and it turns to a hold phase.

Here, when switching over the switches SW3p, SW3m, SW2p and SW2m, the switches SW1p and SW1m are opened, so that the electric charges on both the input terminal T1p and T1 are maintained. Therefore, in the sampling phase and hole phase, the electric charge Q accumulated in both the capacitor Csm and Cfm satisfies Equations (16) and (17) shown below:

$$Q=Csm\cdot(VIN-Vx)+Cfm\cdot(-Vx) \tag{16}$$

$$Q=Csm\cdot(-Vx2)+Cfm\cdot(VOUT-Vx2) \tag{17}$$

where Vx and Vx2 are respectively input voltages in the sampling phase and the hold phase. Vx and Vx2 satisfy Equations (18a) and (18b) shown below:

$$Vx=Vofs \tag{18a}$$

$$Vx2=Vofs \tag{18b}$$

Here, it is assumed that the gain A of the differential amplifier AMP2 is sufficiently large. Further, summing up Equations (15) to (18a) and (18b), the input and output voltages VIN and VOUT of the switched capacitor circuit 11 satisfy Equation (19) shown below:

$$VOUT=(Csm/Cfm)\cdot VIN \tag{19}$$

where the parasite capacitances applied onto the input terminals T1p and T1m are ignored.

Further, in the present embodiment, each component and line of which the switched capacitor circuit 11 is composed are arranged so that no error is caused in operation of the switched capacitor 11 even if a parasite capacitance is generated.

Figure 8:
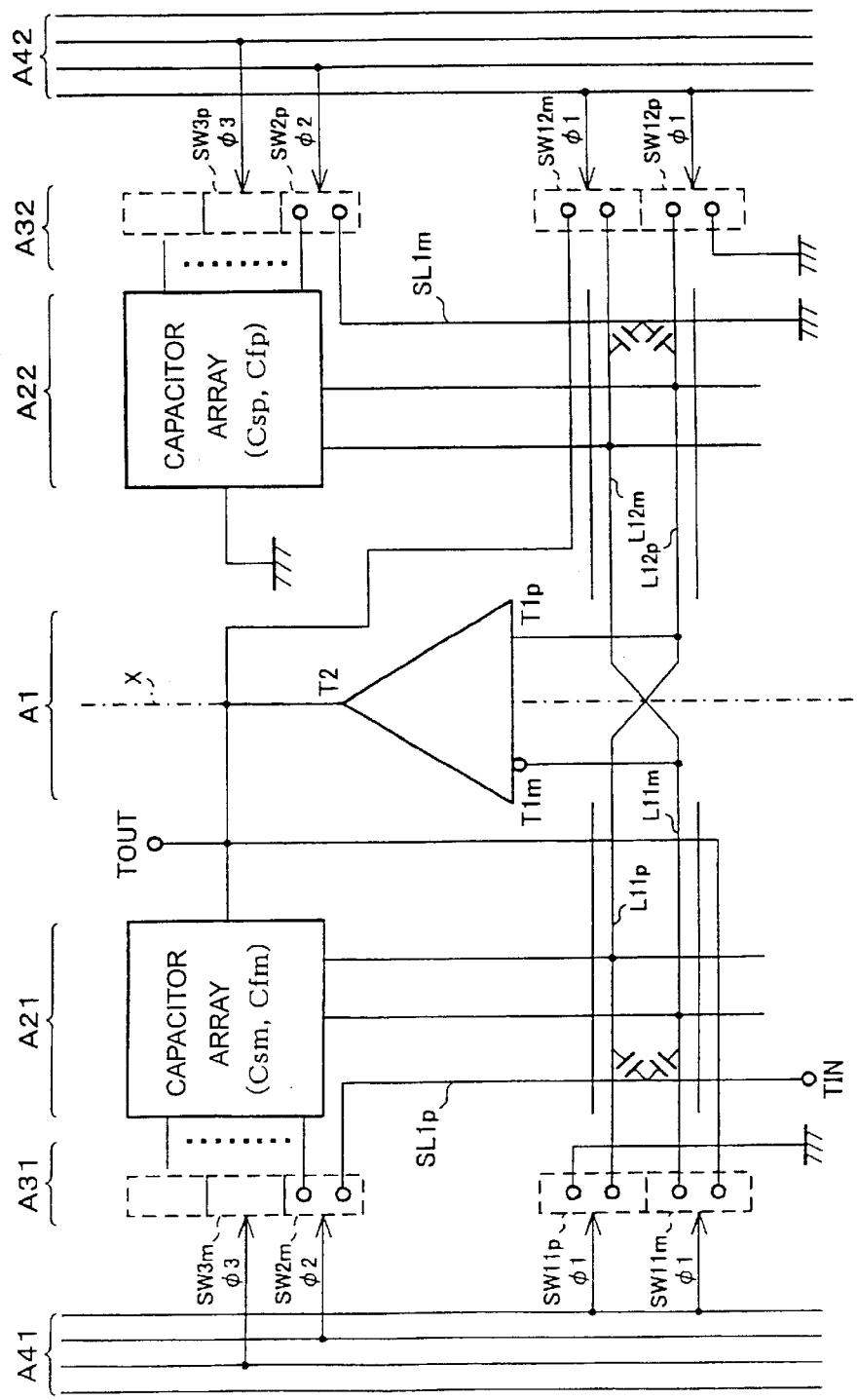
FIG. 8 is an explanatory view showing a layout of the switched capacitor circuit.

Specifically, as shown in FIG. 8, areas A1 to A42 are respectively arranged, similarly to FIG. 1. Moreover, the switch SW1p for resetting the non-inverting input terminal T1p is composed of two switches SW11p and SW12p connected in parallel to each other, similarly to FIG. 1. Similarly, the switch SW1m for resetting the inverting input terminal T1m is composed of two switches SW11m and SW12m connected in parallel to each other, similarly to FIG. 1. Further, the switches SW11p to SW12m and lines L11p to L12m and signal lines SL1p to SL22m, which are connected thereto or are crossed, are arranged similarly to FIG. 1.

Specifically, the switched capacitor circuit 11 of the present embodiment is also arranged such that the lines L11p and L11m are arranged next to each other and the signal line SL1p crosses both of the lines L11p and L11m. As a result, as in the first embodiment, it is possible to cause the signal line SL1p to affect, via parasite capacitances C111p and C111m, the input terminals T1p and T1m of the differential amplifier AMP2 equally to each other in terms of tendency and quantity. As a result, an interference from the signal SL1p is cancelled out by differential operation of the differential amplifier AMP2. Thereby, it is possible to suppress operational errors caused by the interference.

Moreover, the switches SW1p and SW1m respectively for resetting the input terminals T1p and T1m of the differential amplifier AMP2 are respectively divided into two parts, and positioned in the areas A31 and A32. Therefore, compared with a case the switches SW1p and SW1m are not divided, the switches SW11p and SW11m can be positioned to be nearer to each other, while the switches SW12p and SW12m can be positioned to be nearer to each other. Therefore, this cause noise that is from clock signals $\phi 1$ to $\phi 4$, and which enters the input terminal T1p via the switch SW11p, to be substantially equal to noise that is from clock signals $\phi 1$ to $\phi 4$, and which enters the input terminal T1m via the switch SW11m. Moreover, noise via the switch SW12p is caused to be substantially equal to noise via the switch SW12m. With those arrangements, the differential operation of the differential amplifier AMP2 cancel out the noise each other, thereby reducing the operational errors of the switched capacitor circuit 11. In addition to this, the switches SW11$p$ and SW11$m$ can be positioned to be nearer to each other, while the switches SW12$p$ and SW12$m$ can be positioned to be nearer to each other. Thus, matching accuracy of each is improved. Therefore, it is possible to reduce the operational errors of the switched capacitor circuit 11.

In addition, the present embodiment has an arrangement substantially equal to that of the first embodiment, in terms of distances between the respective components, the forming method of the components, and the positioning method of the components, for example, to position the components in the line symmetry. Therefore, the present embodiment can suppress the operational errors of the switched capacitor circuit 11, similarly to the first embodiment.

Note that explained in the present embodiment is the switched capacitor circuit 11 that can compensate the offset voltage Vofs by causing a short circuit between the input and output of the differential amplifier AMP2 when the input voltage VIN is inputted. However, even if no offset compensation is carried out, operational accuracy of the switched capacitor circuit 11 can be improved by arranging such that (a) the switches SW1$p$ and SW1$m$ respectively for resetting the input terminals T1$p$ and T1$m$ of the differential amplifier AMP2, (b) the lines L11$p$ to L12$m$ for the switches SW1$p$ and SW1$m$, and (c) the signal lines crossing each line are arranged in the similar manner to that of the present embodiment.

Moreover, the first and second embodiments are described, discussing the case of the differential input/differential output, and the case of the single-ended input/single-ended output. However, the present invention is not limited to this. Even for a case of the single-ended input/differential output and for a case of the differential input/single-ended output, similar effect can be attained by arranging the switches SW1$p$ and SW1$m$, the lines L11$p$ to L12$m$ for the switches SW1$p$ and SW1$m$, and the lines crossing each line similarly to the present embodiment.

[Third Embodiment]

Figure 9:
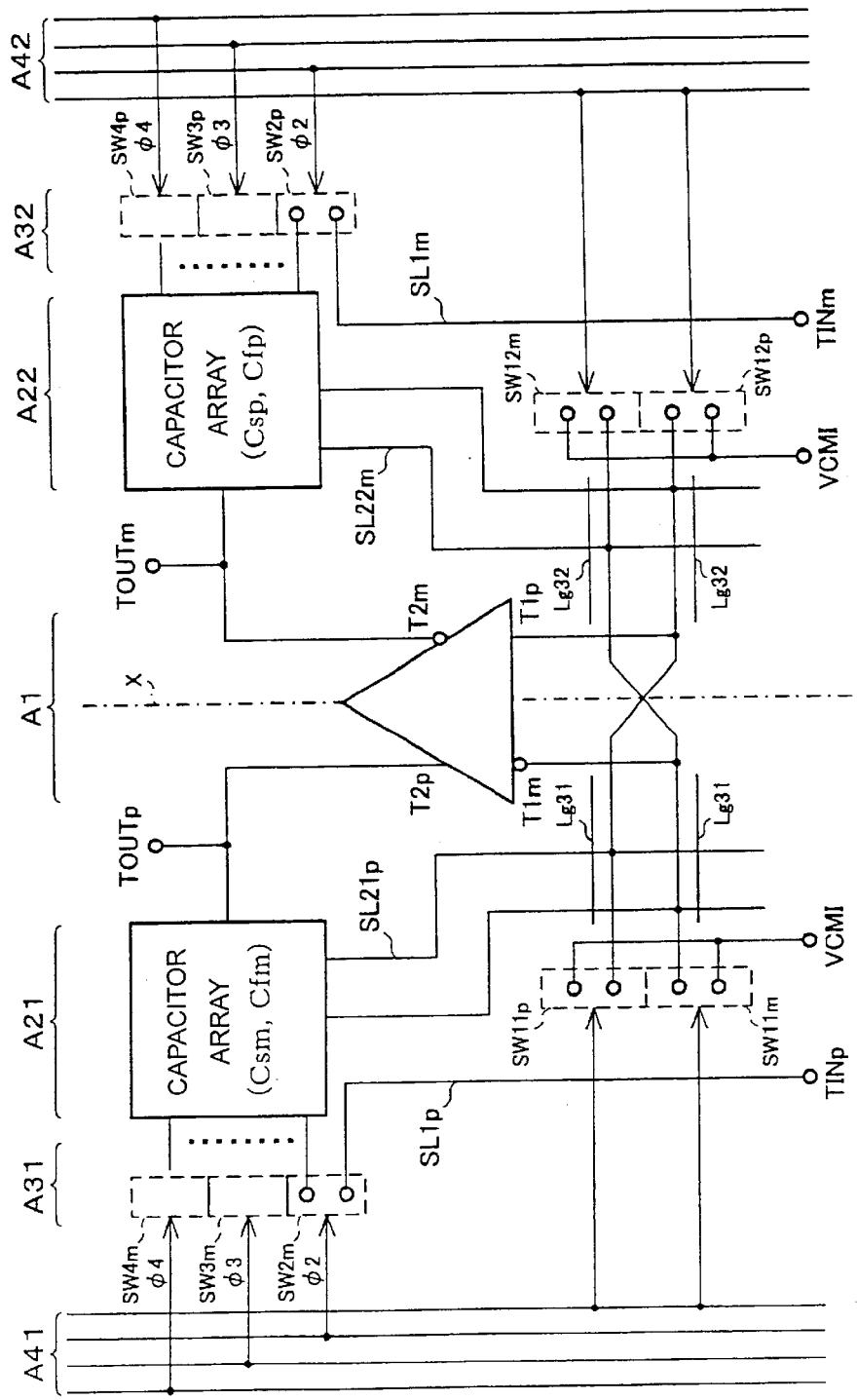
FIG. 9 is an explanatory view illustrating a layout of a switched capacitor circuit of still another embodiment of the present invention.

A switched capacitor circuit of a present embodiment has a layout arrangement different from that of the switched capacitor circuit 1 shown in FIG. 2. In the present embodiment, as shown in FIG. 9, each component of a switched capacitor circuit 21 is positioned substantially similarly to FIG. 1. However, unlike FIG. 1, switches SW11$p$ to SW12$m$ are, for example when being in conformity to the COMS 0.35 $\mu$m rule, positioned so as to be nearer to a differential amplifier AMP1 than to an area A21 (or A22), or so as to have substantially equal distances from the differential amplifier AMP1 to a distance between the differential amplifier AMP1 and the area A21 (or A22), for example, so as to be in a distance ranging from 5 $\mu$m to 100 $\mu$m from the differential amplifier AMP1. Meanwhile, signal lines SL1$p$ and SL1$m$ are positioned so as not to cross each of lines L11$p$ to L12$m$.

With this arrangement, it is possible to reduce, in number, the lines crossing the lines L11$p$ to L12$m$, thereby reducing, in number, parasite capacitances caused therebetween, and thereby reducing parasite capacitances between the respective lines L11$p$ to L12$m$ and a ground level. As a result, it is possible to reduce load capacitances of input terminals T1$p$ and T1$m$ of the differential amplifier AMP1, thereby improving the switched capacitor circuit 21 in terms of operation speed.

Further, with the arrangement in which the switches SW11$p$ to SW12$p$ are in vicinity of each other, it is possible to prevent a signal line for signal transmission from crossing the lines L11$p$ to L12$m$ without being electrically connected. Therefore, the signal line does not interfere the lines L11$p$ to L12$m$, thereby improving the switched capacitor circuit 21 in terms of operational accuracy.

Moreover, in conformity of the CMOS 0.35 $\mu$m rule, set to 5 $\mu$m or more are distance between the differential amplifier (strictly speaking, the input terminals T1$p$ and T1$m$) and each of the switches SW11$p$ to SW12$m$. Thus, it is possible to improve the switched capacitor circuit 21 in terms of operation speed, while suppressing interferences of clock signals to a level at which the operational accuracy will not be deteriorated.

In addition, the switched capacitor circuit 21 has a layout similar to FIG. 1, except of the distance between the differential amplifier AMP1 and the switches SW1$p$ and SW1$m$, and except that the signal lines SL1$p$ and SL1$m$ do not cross each of the lines L11$p$ to L12$m$. With this arrangement, it is possible to prevent operational errors caused by low matching accuracy and asymmetry.

Note that the case of the differential input/differential output is discussed above. However, a similar effect can be attained by arranging the switches SW1$p$ and SW1$m$, the lines L11$p$ to L12$m$ for the switches SW1$p$ and SW1$m$, and the signal lines crossing each line, similarly to the present embodiment, even for the case of differential input/single-ended output, the case of the single-ended input/differential output/, or the case of the single-ended input/single-ended output.

[Fourth Embodiment]

In a present embodiment, as an another layout method, described is an arrangement in which an interference from a signal line is prevented by having such a layout that a signal line for transmitting an inverting signal cross a line connected to one of input terminals T1$p$ and T1$m$ of a differential amplifier AMP1, when a signal line crosses the line. Note that this arrangement is applicable to the case of the single-ended input/single-ended output as shown in FIG. 6, the case of the single-ended input/differential output (not shown), or the case of the differential input/single-ended output (not shown). However, explained below as an example is a case of a switched capacitor circuit of the differential input/differential output.

Figure 10:
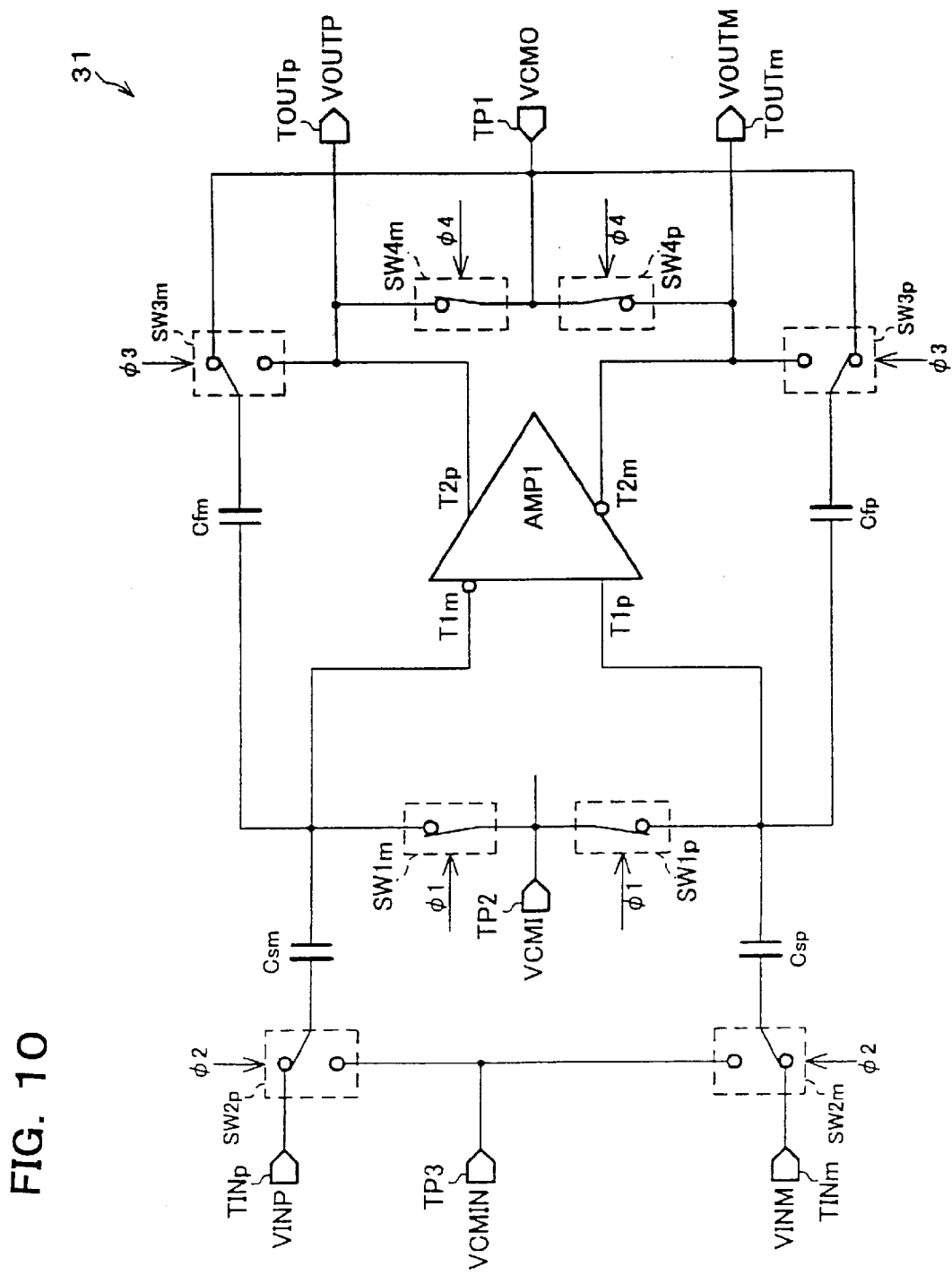
FIG. 10 is a circuit diagram showing a switched capacitor circuit of yet another embodiment of the present invention.
Figure 11:
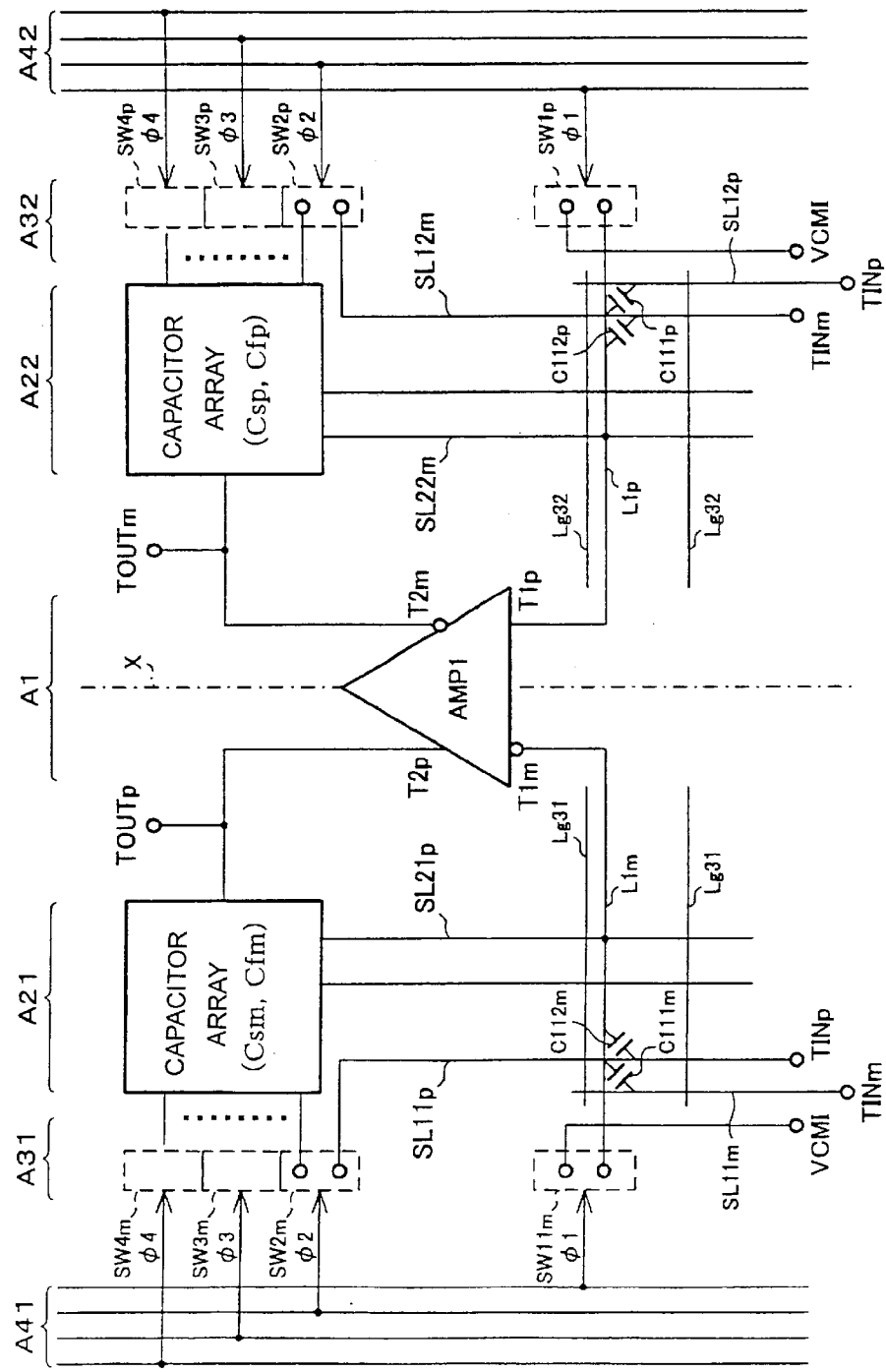
FIG. 11 is an explanatory view illustrating a layout of the switched capacitor circuit.

Namely, a switched capacitor circuit 31 of the present embodiment, as shown in FIG. 10, has a circuit arrangement substantially similar to that of the switched capacitor circuit 1 shown in FIG. 2. However, from that of FIG. 2, the arrangement of the switched capacitor circuit 31 is different in that switches SW1$p$ and SW1$m$ are respectively composed of a single switch. As shown in FIG. 11, one of the switches, namely the switch SW1$p$, is formed in an area A32, while the other one of the switches, namely, the switch SW1$m$, is formed in an area A31.

Moreover, to be in accordance with the above arrangement, the switched capacitor circuit 31 is provided with (a) a line L1$p$ connecting the switch SW1$p$ and a non-inverting input terminal T1$p$ of a differential amplifier AMP1, and (b) a line L1$m$ connecting the switch SW1$m$ and an inverting input terminal T1$m$ of the differential amplifier AMP1, instead of the lines L11$p$ to L12$m$ shown in FIG. 1.

Further, the line L1$m$ of the present embodiment is crossed by not only a signal line SL11$p$ that receives a non-inverting input signal VINP, but also a signal line SL11$m$ that receives an inverting input VINM, which is an inverting signal for the non-inverting input signal VINP. Similarly the line L1$p$ is crossed by not only a signal line SL12$m$ that receives the inverting input signal VINM, but also a signal line SL12$p$ for transmitting the non-inverting input signal VINP, which is an inverting signal for the inverting input signal VINM.

Figure 4:
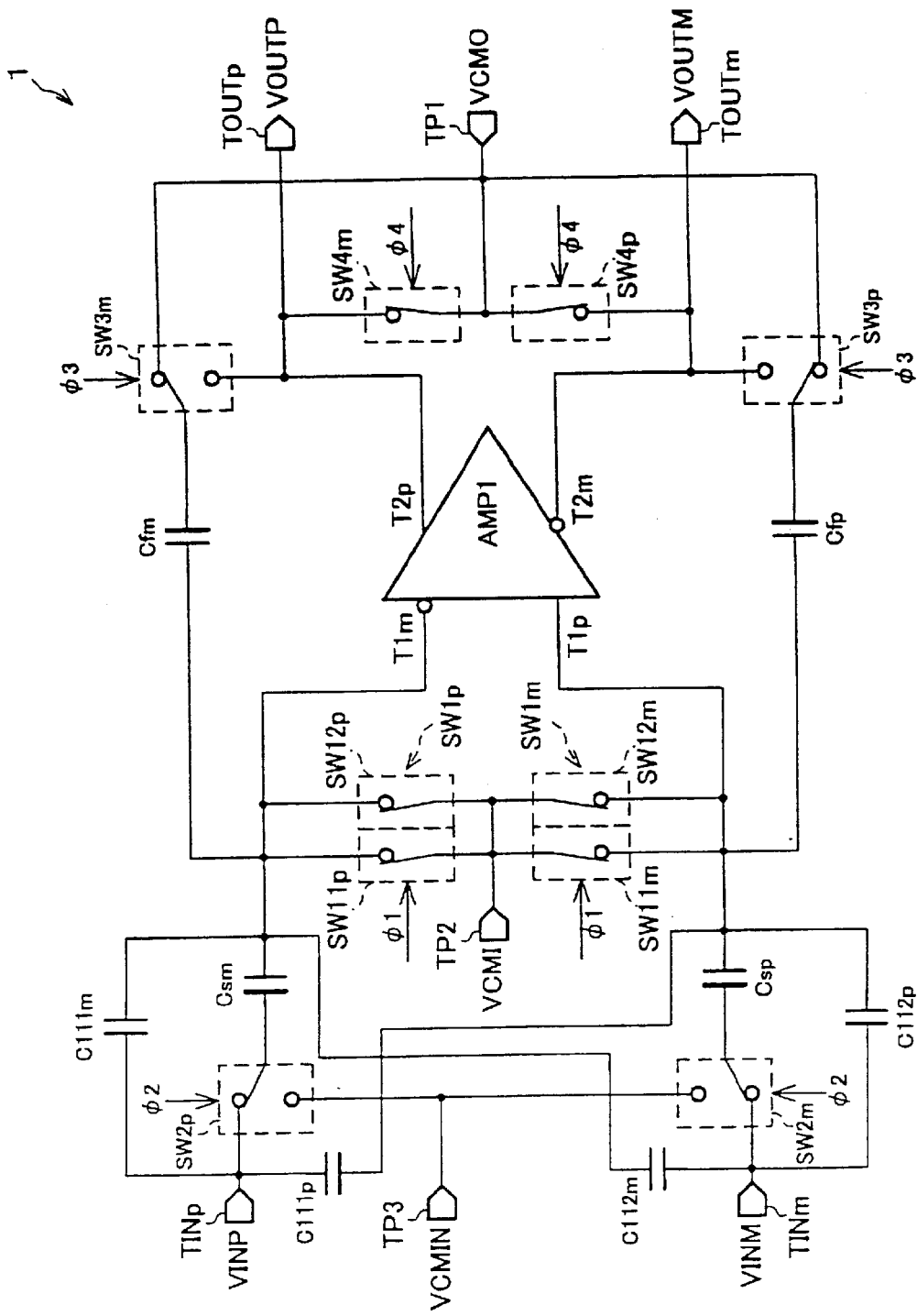
FIG. 4 is a circuit diagram showing the switched capacitor circuit together with illustration of parasite capacitance caused by crossing a line and a signal line is included.

The signal lines SL11p and SL11m (or SL12p and SL12m) are positioned in parallel to each other and in vicinity of each other, for example, having a gap distance therebetween of approximately 0.2 µm to 100 µm in vicinity of a cross-point.

Where parasite capacitances respectively formed between the line L1m and the signal line SL11p and between the line L1m and the signal line SL11m are respectively denoted as C112m and C111m, and parasite capacitances respectively formed between the line L1p and the signal line SL12p and between the line L1p and the signal line SL12m are respectively denoted as C112p and C111p, the arrangement will be illustrated as the same circuit diagram as FIG. 4, thus satisfying Equations (4) and (5). Moreover, because the signal lines SL11p and SL11m are positioned in vicinity of each other and in parallel to each other, and the signal lines SL12p and SL12m are positioned in vicinity of each other and in parallel to each other, a capacitance of the parasite capacitance C112p is substantially equal to that of the parasite capacitance C111p. Similarly, a capacitance of the parasite capacitance C112m is substantially equal to that of the parasite capacitance C111m for the same reason. Therefore, as described by Equation (6), interferences of the signal line SL12m and the signal line SL12p on the line L1p cancel out each other, while interferences of the signal line SL11m and the signal line SL1p on the line L1m cancel out each other, even if the parasite capacitances are taken into consideration. As a result, it is possible to reduce operational errors of the switched capacitor circuit 31 due to the parasite capacitances at the cross-points of the signal lines.

Note that the present embodiment is arranged such that the switch SW1p for resetting the non-inverting input terminal T1p of the differential amplifier AMP1 is provided only in the area A31 on one side of the differential amplifier AMP1, while the switch SW1m for resetting the inverting input terminal T1m is provided in the area A23 on the other side of the differential amplifier AMP1, unlike the first embodiment. Thus, with the arrangement, both the switches SW1p and SW1m tend to have low matching accuracy, compared with the first embodiment. Therefore, in case it is necessary to further suppress operational errors of a switched capacitor circuit, it is preferable that the switches SW1p and SW1m are respectively provided on both sides, as the first embodiment.

Incidentally, the respective above-mentioned embodiments (i) discuss that in the switched capacitor circuits, the input terminals T1 and T2 of the differential amplifier AMP1 (AMP2) are the nodes, which become high impedance so that their parasite capacitances causes leakage that directly affecting the operational accuracy, and (ii) describe the arrangement of the components with which (a) the operational errors caused by the signal lines crossing the nodes and (b) the operational errors caused by the low matching accuracy between the switches SW1p and SW1m for resetting the nodes can be suppressed. However, the present invention is not limited to this.

Figure 12:
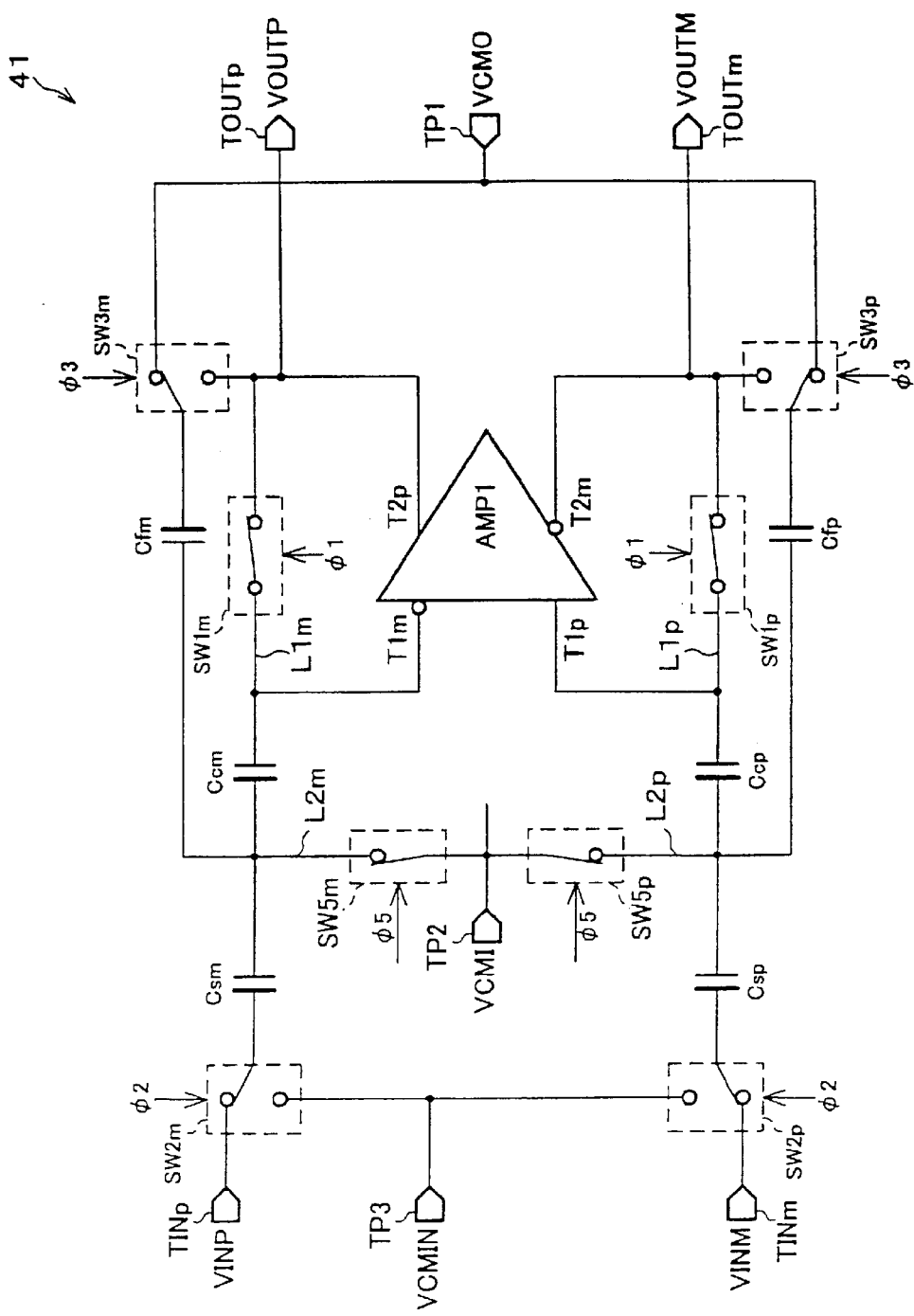
FIG. 12 is a circuit diagram showing a switched capacitor circuit of modification of the respective embodiments.
Figure 13:
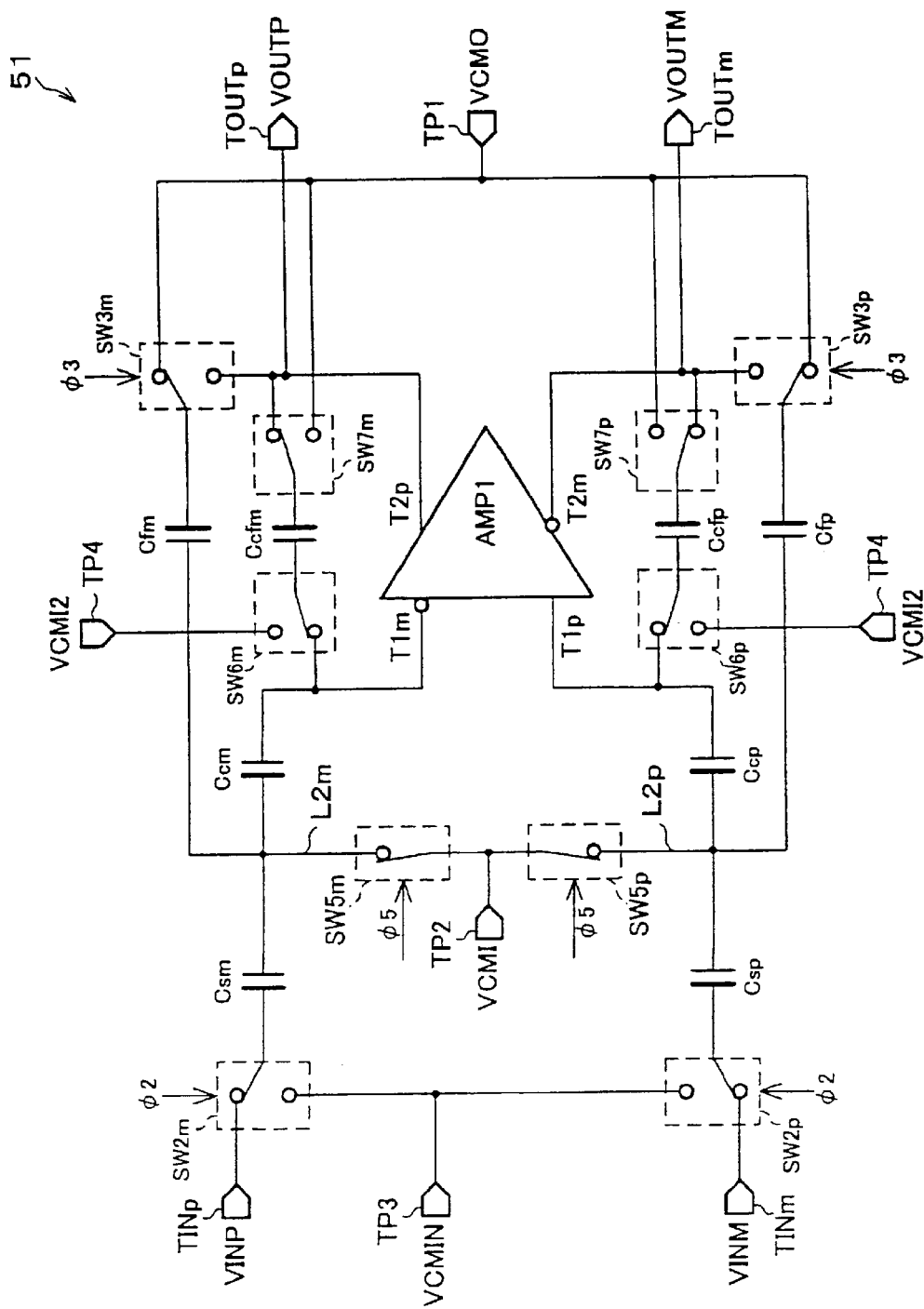
FIG. 13 is a circuit diagram illustrating a switched capacitor circuit of another modification of the respective embodiments.

For instance, even for nodes, such as lines L2p and L2m in switched capacitor circuits 41 and 51 shown in FIGS. 12 and 13, the nodes being respectively connected to the input terminals T1p and T1m via the capacitor, if operation of the switched capacitor circuit is carried out in accordance with the principle of conservation of charge at the nodes, the operational accuracy of the switched capacitor circuit is affected by leakage due to parasite capacitances applied on the nodes. Therefore, a degree of effect can be attained by having an arrangement, in which the nodes and signal lines are crossed, and switches for resetting the nodes are provided, as the respective forgoing embodiments.

Specifically, the switched capacitor circuit 41 shown in FIG. 12 is a circuit that can compensate an offset voltage of a differential amplifier AMP1, similarly to the switched capacitor circuit 1a shown in FIG. 5. However, dissimilarly to the switched capacitor circuit 1a, the switched capacitor circuit 41 is provided with capacitors Ccp and Ccm for maintaining an electric charge that is in accordance with the offset voltage of the differential amplifier AMP1. The capacitors Ccp and Ccm are respectively provided between an input capacitor Csp and a non-inverting input terminal T1p, and between an input capacitor Csm and an inverting input terminal T1m. Further, the switched capacitor circuit 41 is provided with a switch SW5p for resetting a node (line L2p) between the input capacitor Csp and the capacitor Ccp, and a switch SW5m for resetting a node (line L2m) between the input capacitor Csm and the capacitor Ccm, so that a reference voltage VCMI is applied on the respective nodes via a power supply terminal TP2 and the respective switches SW5p and SW5m when each of the switches SW5p and SW5m is closed.

In the switched capacitor circuit 41 having the arrangement, in a sampling phase the switches SW5p and SW5m and switches SW1p and SW1m are closed, and switches SW2p and SW2m select input terminals TINp and TINm of the switched capacitor circuit 41 as shown in FIG. 12. Moreover, switches SW3p and SW3m select a power supply terminal TP1 on which a reference voltage VCMO is applied.

In this state, similarly to the switched capacitor circuit 1a shown in FIG. 5, the switch SW1p is closed so that the non-inverting input terminal T1p is reset, whereby a potential Vxp of the non-inverting input terminal T1p has a value in accordance with an offset voltage Vofsp of the differential amplifier AMP1. Further, the switch SW5p is closed so that the reference voltage VCMI is applied, thereby resetting the line L2p so as to accumulate an electric charge in the capacitor Ccp, the electric charge being in accordance with a difference between a potential Vxp and the reference voltage VCMI. Similarly, the inverting input terminal T1m and the line L2m are reset, while a potential Vxm of the inverting input terminal T1m has a value that is in accordance with an offset voltage Vofsm of the differential amplifier AMP1, so as to accumulate an electric charge in the capacitor Ccm, the electric charge being in accordance with a difference between the potential Vxm and the reference voltage VCMI. Note that in this state the switches SW5p and SW5m are closed. Thus, regardless of whether the offset voltage is high or low, the electric charges respectively in accordance with the input voltages VINM and VINP of the switched capacitor circuit 41 are accumulated respectively in the input capacitors Csp and Csm, while the electric charges accumulated in integral capacitors Cfp and Cfm are discharged.

On the other hands, when the switches SW5p and SW5m are opened after the switches SW1p and SW1m are opened, the sampling phase is ended. In this stage, the respective switches SW1p, SW1m, SW5p and SW5m are opened. Thus, the lines L1p, L1m, L2p, and L2m respectively become floating nodes, thereby maintaining the electric charges. Further, the switches SW2p and SW2m select so as to let the reference voltage VCMIN pass through, and the switches SW3p and SW3m respectively the output terminals TOUTm and TOUTp of the switched capacitor circuit 41.

In this state, the potential of the non-inverting input terminal T1p is equal to the potential Vxp, when the gain A of the operational amplifier AMP1 is sufficiently large, and the parasite capacitance generated in the non-inverting input terminal is sufficiently small compared with electrostatic capacitance of the capacitors Ccp and Ccm. Similarly, the potential of the inverting input terminal T1m is equal to the potential Vxm. In this case, the potentials of the lines L2m and L2p are equal to the potential of the reference voltage VCMI. Thereby, the offset is compensated. Thus, input and output voltages of the switched capacitor circuit 41 satisfy Equation (20) shown below:

$$Cs \cdot (VINP-VINM) = Cf \cdot (VOUTP-VOUTM) \qquad (20),$$

where the parasite capacitances are ignored.

Moreover, the switched capacitor circuit 51 shown in FIG. 13 has an arrangement identical to that of the switched capacitor circuit 41 shown in FIG. 12, except that in the switched capacitor circuit 51 a common mode voltage of input voltages Vip and Vim of a differential amplifier AMP1 is different from a common mode voltage of output voltages of Vop and Vom thereof. In accordance with the arrangement, the switched capacitor circuit 51, which is a present modification, is provided with, instead of the switch SW1p, (a) a capacitor Ccfp, (b) a switch SW6p for selecting one of a power supply terminal TP4 on which a reference voltage VCMI2 is applied and a non-inverting input terminal T1p, and for connecting the selected one to one end of the capacitor Ccfp, and (c) a switch SW7p for selecting one of a power supply terminal TP1 on which a reference voltage VCMO is applied and an output terminal T2m, and for connecting the selected one to another end of the capacitor Ccfp. Similarly, provided in the switched capacitor circuit 51 are a capacitor Ccfm, a switch SW6m and a switch SW7m, instead of the switch SW1m.

With the arrangement, as to the differential amplifier AMP1 and the capacitors Ccfp and Ccfm, in a hold phase, the switches SW6p, SW6m, SW7p, and SW7m respectively are so switched over as to let the reference voltage pass through. Therefore, just before a following sampling phase, accumulated respectively in the capacitors Ccfp and Ccfm are such electric charges that cause a voltage across the capacitor Ccfp and a voltage across the capacitor Ccfm to be equal to a difference between the reference voltage VCMI and reference voltage VCMO, that is, a difference between the common mode voltages.

When entering sampling phase, the switches SW5p and SW5m are respectively closed, while the switches SW3p, SW3m, SW5p, SW5m are respectively switched over. Here, a gain A of the differential amplifier AMP1 is sufficiently large. Therefore, in the sampling phase, the voltage across the capacitor Ccfp and the voltage across the capacitor Ccfm respectively become equal to a difference between the input common code voltage and the output common code voltage. Thus, accumulated respectively in the capacitor Ccp and Ccm are electric charges that cause a voltage across the capacitor Ccp and a voltage across the capacitor Ccm to be equal to a voltage that is equal to a difference between the reference voltage VCMI and the input common mode voltage of the differential amplifier AMP1 plus the offset voltage of the differential amplifier AMP1.

Further, in a following hold phase, the switches SW5p and SW5m are opened, and the switches SW3p, SW3m, SW6, SW6m, SW7p, and SW7m are switched over. Here, assuming there is no parasite capacitance in lines connected to the input terminals T1p and T1m of the differential AMP1, the electric charges accumulated in the capacitors Ccp and Ccm are maintained before and after the switching-over. Thus, the voltages respectively across the capacitors Ccp and Ccm are unchanged. Therefore, both the capacitors Ccp and Ccm function as simple voltage shifters, so that a voltage applied onto an input side (the side on which the lines L2p and L2m are positioned) can be shifted as much as a voltage that is equal to a difference between the reference voltage VCMI and the input common mode voltage of the differential amplifier AMP1 plus the offset voltage of the differential amplifier AMP1.

As a result, the offset voltage of the differential amplifier AMP1 is cancelled, so that the differential amplifier AMP1 and the capacitors Ccp and Ccf operate together as one differential amplifier having no offset voltage.

Explained below is how the whole switched capacitor circuit 51 operates. The switches SW5p and SW5m are closed, while the switches SW2p and SW2m select input terminals TINm and TINp of the switched capacitor circuit 51, in the sampling phase.

With this arrangement, the electric charges of the lines L2p and L2m are respectively discharged, so as to reset the lines L2p and L2m. Further, an electric charge that is in accordance with the difference between the input voltage VINM and the reference voltage VCMI is accumulated in the input capacitor Csp, while an electric charge that is in accordance with the difference between the input voltage VINP and the reference voltage VCMI is accumulated in the input capacitor Csm.

Moreover, in the sampling phase, the switches SW3p and SW3m select the reference voltage VCMO, so that a difference between the reference voltage VCMI and the reference voltage VCMO, that is, a difference between the common mode voltages is accumulated both in integral capacitors Cfp and Cfm.

On the other hand, when the sampling phase is ended, the switches SW5p and SW5m are opened, while the switches SW2p, SW2m, SW3p and SW3m are switched over. Here, an electric charge of a node (line L2p) among the capacitors Csp, Cfp and Ccp, and an electric charge of a node (line L2m) among the capacitors Csm, Cfm, and Ccm are respectively maintained. Moreover, as described above, the differential amplifier AMP1 and both the capacitors Ccp and Ccf can be regarded as one differential amplifier having no offset voltage. Therefore, ignoring the parasite capacitances of the lines L2p and L2m, input and output voltages of the switched capacitor 51 satisfy Equation (21) shown below:

$$Cs \cdot (VINP-VINM) = Cf \cdot (VOUTP-VOUTM) \qquad (21).$$

In both the arrangements shown in FIGS. 12 and 13, leakage that is caused by the parasite capacitances applied onto the lines L2p and L2m affects operational accuracy of the switched capacitance circuits. Operational errors due to the parasite capacitances can be suppressed by having an arrangement in which the nodes and the signal lines are crossed and the switches for resetting the nodes are provided, as the respective embodiment discussed above.

Figure 14:
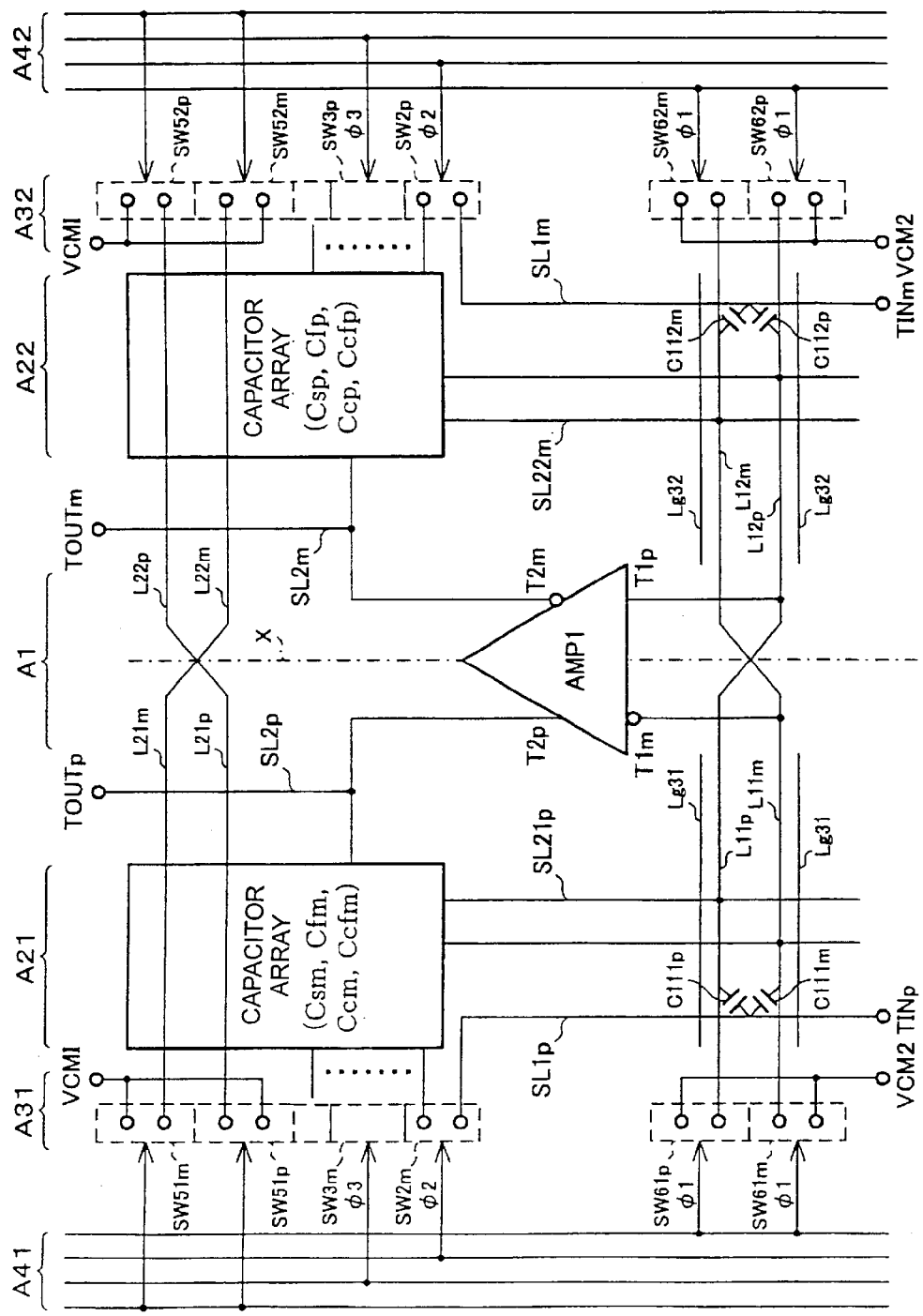
FIG. 14 is an explanatory view showing a layout of the switched capacitor circuits of the respective modifications, illustrating the another modification.

For example, in FIG. 14, the respective components of the switched capacitor circuit 51 of FIG. 13, namely, the components L2p, L2m, SL2p, SL2m, SW5p and SW5m are positioned similarly to the respective components of the first embodiment, namely, the components L1p, L1m, SL1p, SL1m, SW1p, and SW1m.

Specifically, the switch SW5p is divided into a switch SW51 provided in an area A31 and a switch SW52p provided in an area A32, while the line L2p is divided into a line L21p connected to the switch SW51p and a line 22p connected to the switch SW52p. Similarly, the switch SW5m is divided into switches SV51m and SW52m respectively provided in the areas A31 and A32, while the line L2m is divided into the lines L21m and L22m. Moreover, the switches SW51p and SW52m are positioned in line symmetry to each other with respect to the central axis X, while the switches SW51m and SW52p are positioned in line symmetry to each other with respect to the central axis X. Further, the lines L21p and L21m are positioned next to each other, while the lines L22m and L22p are positioned next to each other. Further, the signal line SL2p, which is connected to the terminal TOUTp, crosses both the lines L21p and L21m, while the signal line SL2m, which is connected to the terminal TOUTm, crosses both the lines L22p and L22m. Additionally, in FIG. 14, capacitor arrays and the lines L2p and L2m overlap each other, so that each capacitor and the lines can be connected without an outgoing line.

With the arrangement described above, it is possible to improve matching accuracy between the switches SW51p and SW51m, and matching accuracy between the switches SW52p and SW52m. For this reason, an effect of clock noise that enters the line L2p is substantially equal to that of clock noise that enters the line L2m. Further, in the arrangement described above, the signal line SL2p crosses the lines L2p and L2m, so that parasite capacitance between the signal line SL2p and the line L2p will be substantially equal to that between the signal line SL2p and the line L2m, and, similarly, so that parasite capacitance between the signal line SL2m and the line L2p will be substantially equal to that between the signal line SL2m and the line L2m. Therefore, interferences from the signal lines onto the lines L2p and L2m are substantially equal to each other. This makes it possible to cause the effects to cancel out each other and to cause the interferences to cancel out each other, by differential operation by using the differential amplifier AMP1. This improves operational accuracy of the switched capacitor circuit 51.

Figure 15:
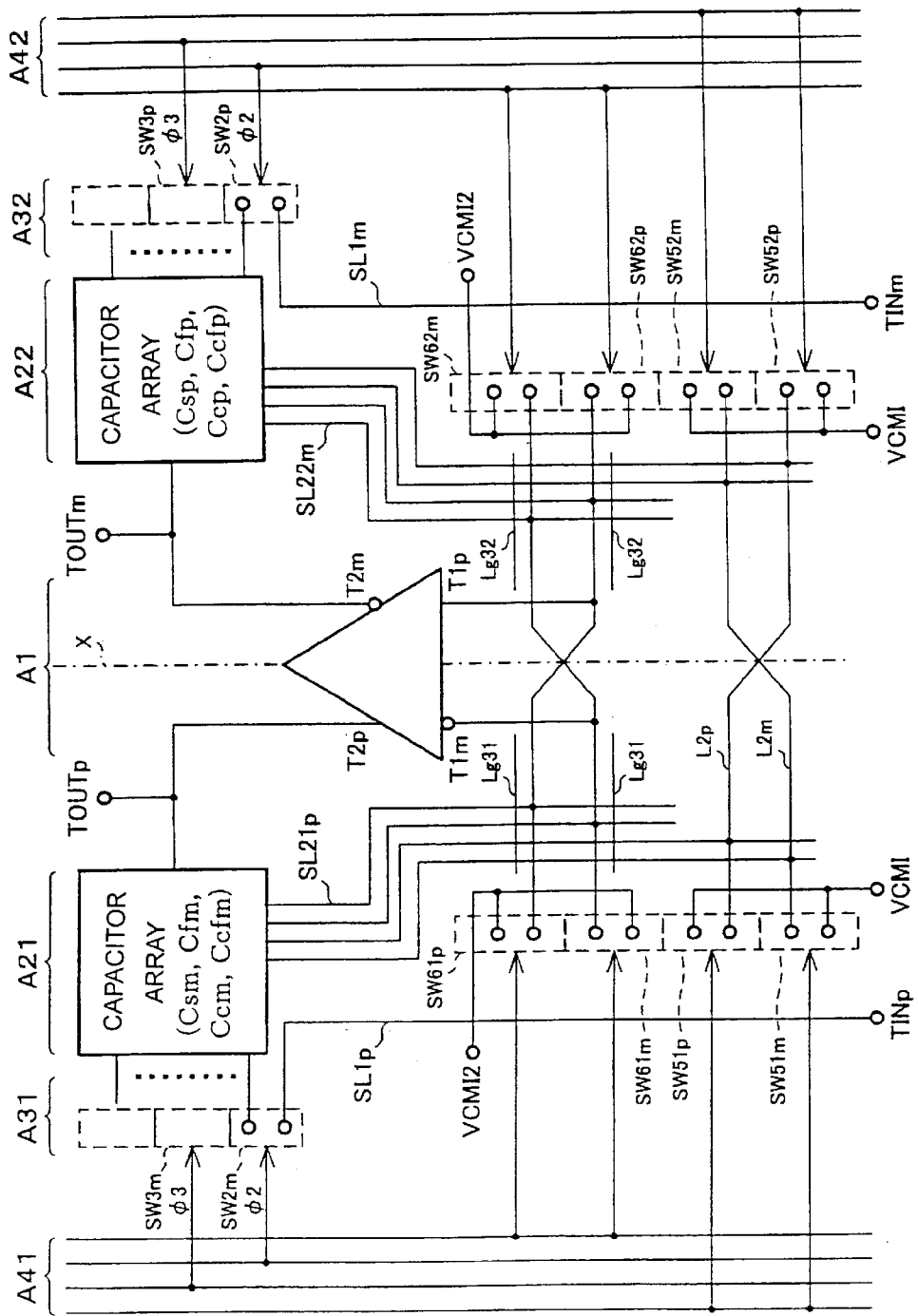
FIG. 15 is an explanatory view illustrating another layout of the switched capacitor circuits of the respective modifications, illustrating the another modification.
Figure 16:
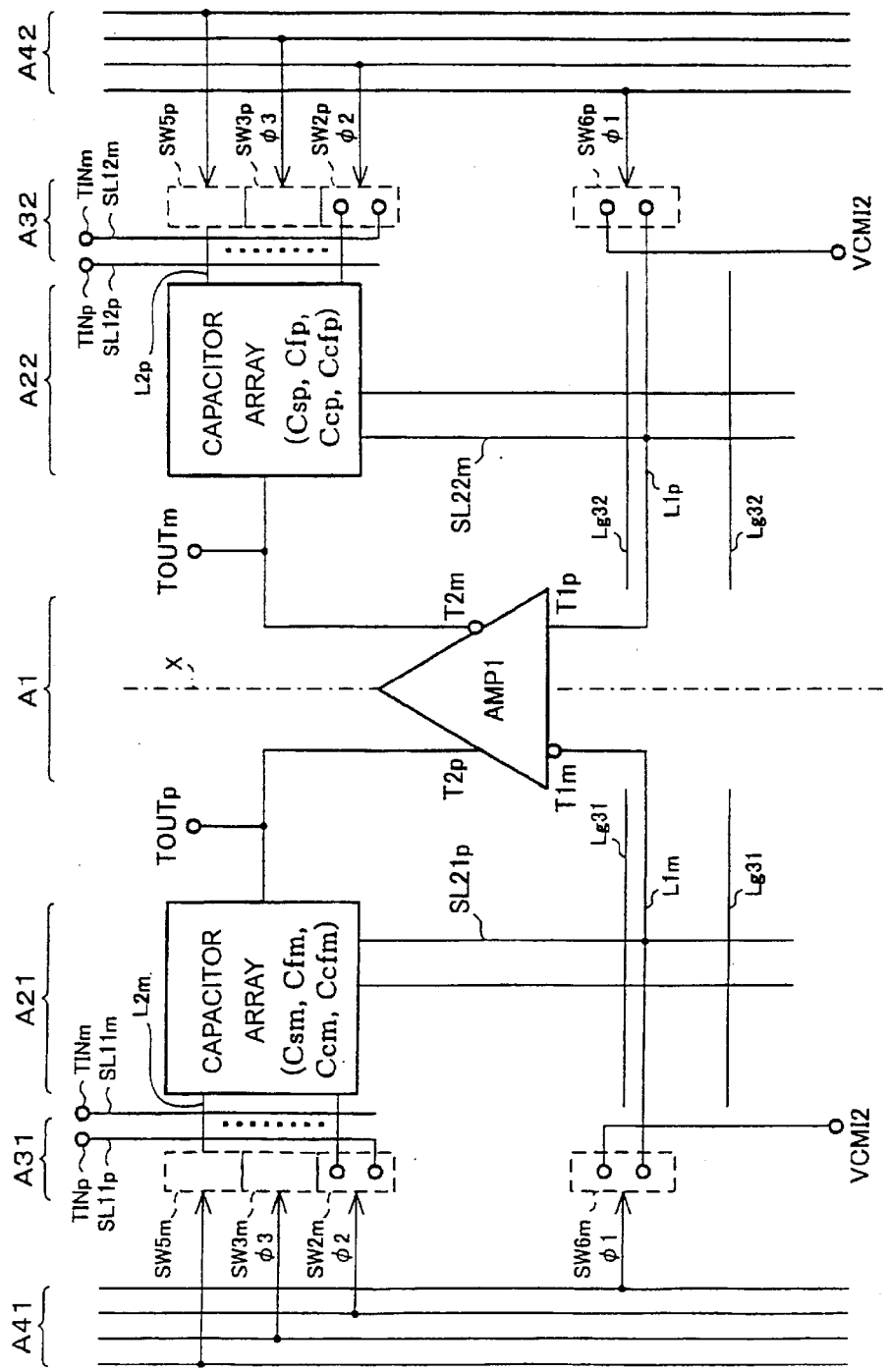
FIG. 16 is an explanatory view showing still another layout of the switched capacitor circuits of the respective modifications, illustrating the another modification.
Figure 17:
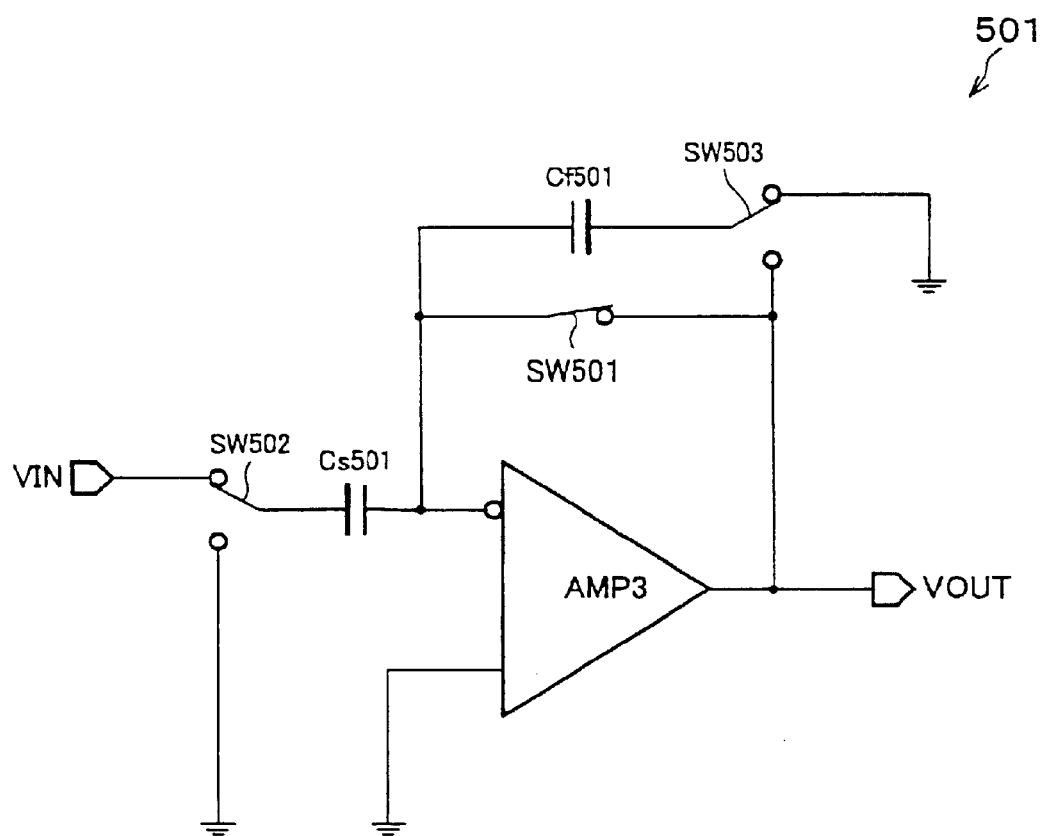
FIG. 17 is a circuit diagram of a conventional switched capacitor circuit.
Figure 18:
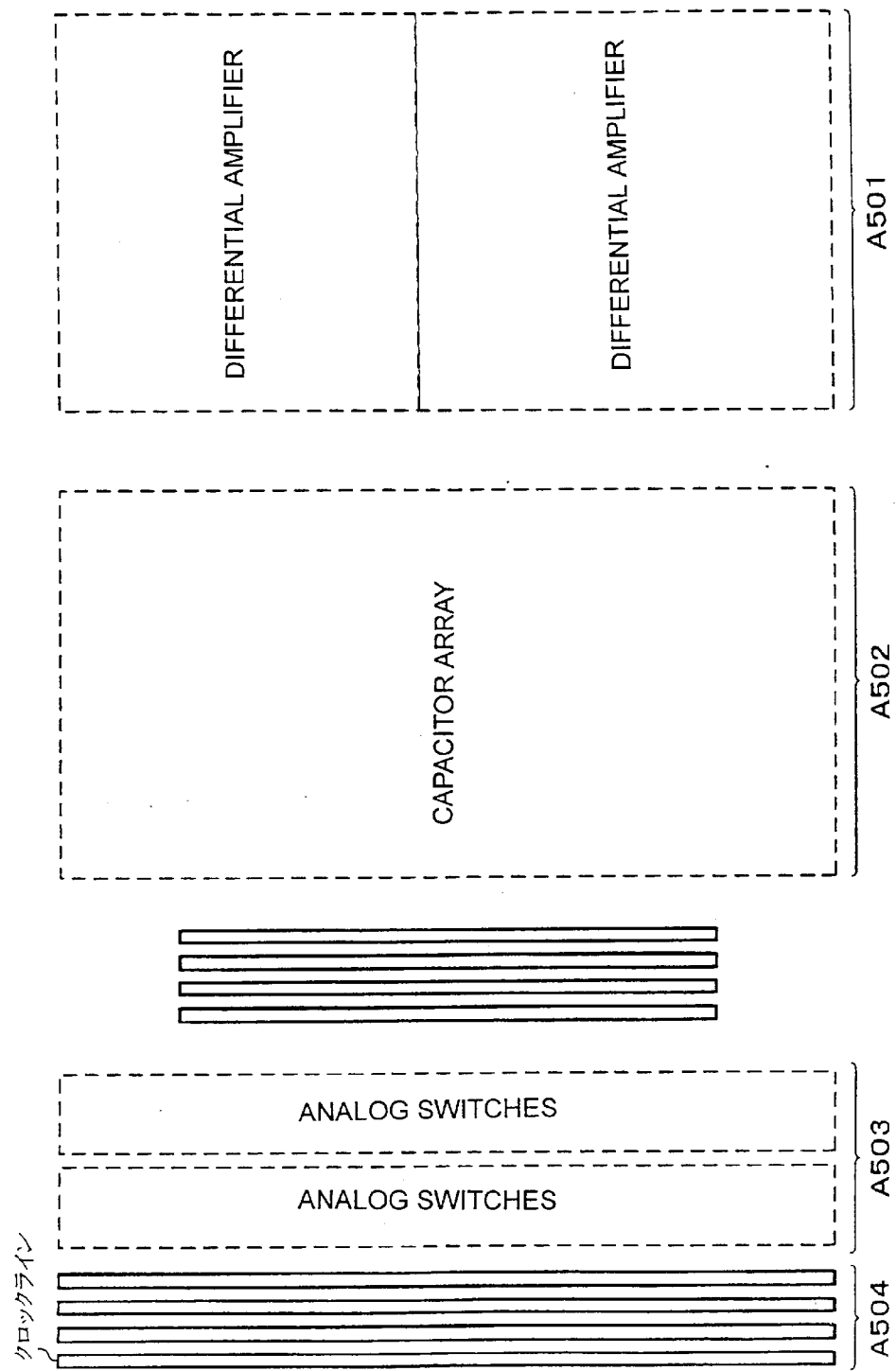
FIG. 18 is an explanatory view showing a layout of the conventional switched capacitor circuit.
Figure 19:
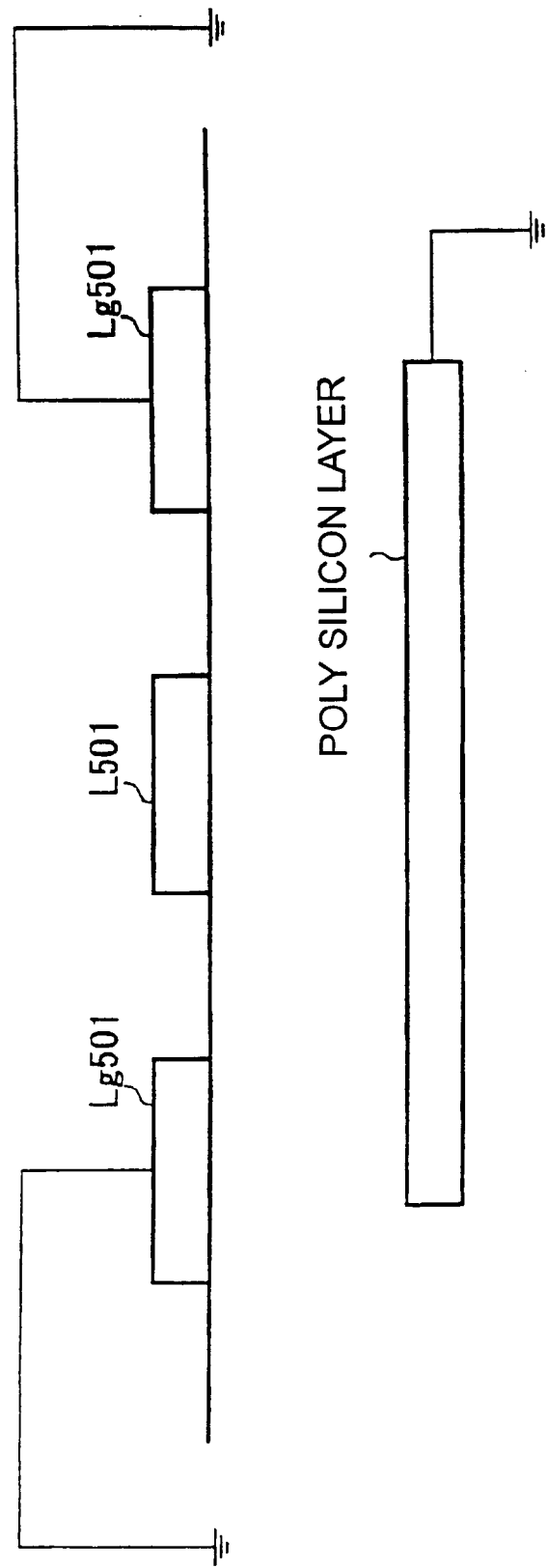
FIG. 19 is a cross sectional view illustrating how guard lines are arranged in the conventional switched capacitor circuit.

Moreover, if the respective components of the switched capacitor circuit 51 of FIG. 13, namely, the components L2p, L2m, SL2p, SL2m, SW5p and SW5m are arranged similarly to the respective components of the third embodiment or the fourth embodiment, namely, the components L1p, L1m, SL1p, SL1m, SW1p and SW1m, the switched capacitor circuit 51 is illustrated as in FIG. 15 or 16.

In the arrangement of FIG. 15, which is substantially similar to the third embodiment, the switches SW5p and SW5m are respectively divided into two parts. The switches SW51p and SW51m are positioned to be closer to the differential amplifier AMP1 than is an area A21 for the capacitor, or are positioned to have substantially equal distances from the differential amplifier AMP1, to a distance between the differential amplifier AMP1 and the area A21 (that is, the respective distances (a) between the differential amplifier AMP1 and the switch SW51p and (b) between the differential amplifier AMP1 and the switch SW51m are less than or substantially equal to the respective distances (c) between the differential amplifier AMP1 and the area A21 and (d) between the differential amplifier AMP1 and the area A22). Similarly, the switches SW52p and SW52m are positioned to be closer to the differential amplifier AMP1 than is an area A22 for the capacitor, or are positioned to have substantially equal distances from the differential amplifier AMP1 to a distance between the differential amplifier AMP1 and the area A22 (that is, the respective distances (a) between the differential amplifier AMP1 and the switch SW52p and (b) between the differential amplifier AMP1 and the switch SW52m are less than or substantially equal to the respective distances (c) between the differential amplifier AMP1 and the area A22 and (d) between the differential amplifier AMP1 and the area A22). For example, the distances from the switches SW52p and SW52m to the differential amplifier AMP1 are approximately 5 μm to 100 μm, in case it is in conformity with the COMO 0.35 μm rule. Further, the signal lines SL2p and SL2m, which are connected to the input terminals TINp and TINm of the switched capacitor circuit 51, are positioned so as to cross none of the lines L2p and L2m.

In the above arrangement, the switches SW5p and SW5m are positioned to be closer to the differential amplifier AMP1 so that the signal lines will not cross the lines L2p and L2m. Therefore, the above arrangement reduces the operational error of the switched capacitor circuit 51 due to the crossing, even if the layout is so simple. Further, in the above arrangement, the distances between the differential amplifier AMP1 and the switches SW5p and SW5m are set to be 5 μm or more. Thus, it is possible to improve the operation speed of the switched capacitor circuit 51, while suppressing interferences of clock signals onto the differential amplifier AMP1 via the switches SW51p to SW52m and a substrate, to a level at which the interferences will not deteriorate the operational accuracy.

Additionally, in FIGS. 14 and 15, the switches SW6p and SW6m are divided into switches SW61p to SW62m, similarly to the first and third embodiments.

Further, in the arrangement of FIG. 16, substantially similarly to the fourth embodiment, in case a signal line such as the signal line SL11p connected to the terminal TINp crosses at least one of the lines L2p and L2m (for example, the line L2m), an inverting signal line (for example, the signal line SL11m) crosses the one of the lines L2p and L2m, the inverting signal line being for transmitting an inverting signal of a signal to be transmitted via the signal line (for example, the signal line SL11p). With this arrangement, an interference from the inverting signal line to the lines and that from the signal line to the lines are substantially equal in terms of magnitude but are different in terms of direction. As a result, the interferences cancel each other, thereby preventing deterioration in the operational accuracy of the switched capacitor circuit 51, which is caused by the interferences.

Note that the present invention is not limited to the first to the fourth embodiments, which discuss the cases in which the differential amplifier (AMP1, AMP2) and the analog switches (SW1p to SW4m) are formed by the CMOS process. The present invention attains similar effects in case where the other process, such as bipolar, is applied to form those components. Moreover, the respective embodiments discuss, as an example, the sample-and-hold amplification-type switched capacitor circuit as the switched capacitor circuit. However, the present invention attains similar effects when the present invention is applied to switched capacitor circuits of the other kinds, such as an integrator.

Moreover, discussed in the above are the cases the areas A31 and A32 for the switches are respectively provided on outer sides of the areas A21 and A22 for the capacitors. However, the areas A21, A22, A31, and A32 may be so arranged that the area A31 and the area A21 are positioned along a vertical direction (of the figures) on one of the sides of the area A1, while the area A32 and the area A22 are positioned along the vertical direction on the other of the sides of the area A1, so that area A1 is sandwiched between (a) the areas A21 and A31 and (b) the areas A22 and A32, along a horizontal direction (of the figures, perpendicular to the vertical direction). Moreover, the areas A21, A22, A31, and A32 may be so arranged that the areas A21 and A22 are respectively positioned on both sides of the area A1 along a direction (for example, the horizontal direction), while the area A31 and A32 are positioned along a direction (for example, the vertical direction) perpendicular to the direction along which the A21 and A22 are positioned. Similar effects can be attained even if the area of the differential amplifier and the areas for the switches are positioned along a different direction from a direction along which the areas for the switches and the areas for the capacitors are positioned, as the above-described arrangement. However, it is preferable that the areas A41 and A42 for the clock lines are positioned to have outermost positions with respect to the other areas.

It should be noted that the above embodiments describe the cases in which the areas respectively for the capacitors, switches, and clock signal lines are provided two each and positioned on both sides of the differential amplifier AMP1 (AMP2). However, even if the areas respectively for the components are provided one each, it is possible to realize the arrangement recited in the third embodiment, in which the switches SW1$p$ and SW1$m$ (SW5$p$ and SW5$m$) are positioned in vicinity of each other, or the arrangement of the inverting signal line, described in the fourth embodiment. Thus, similar effects can be attained to some degree. Further, again in this case, similar effects can be attained to some degree by arranging the lines L1$p$ and L1$m$ (L2$p$ and L2$m$) to be next to each other, at least from ends of the differential amplifier AMP1 (AMP2) to vicinities of cross-points between the lines L1$p$ and L1$m$ (L2$p$ and L2$m$) and the signal line. However, the matching accuracy can be more improved, and thus the operational accuracy is more improved when the areas are provided two each, as the respective embodiments.

Moreover, the arrangements of the switched capacitor circuit 51 of FIG. 13 are explained, with reference to FIGS. 14, 15, and 16. However, the switched capacitor circuit 41 may be arranged similarly to the arrangements shown in FIGS. 14, 15, and 16, thereby attaining similar effects.

As described above, a switched capacitor circuit (1, 1$a$, 11, 21, 31, 41, 51) of the present invention includes (a) a differential amplifier (AMP1, AMP2), (b) a non-inverting-side line (L1$p$, L2$p$, L11$p$, L12$p$, L21$p$, L22$p$) connected to a non-inverting input terminal of the differential amplifier, (c) an inverting-side line (L1$m$, L2$m$, L11$m$, L12$m$, L21$m$, L22$m$) connected to an inverting input terminal of the differential amplifier, wherein a signal line (SL1$p$, SL1$m$, SL2$p$, SL2$m$, SL11$p$, SL11$m$, SL12$p$, SL12$m$) crossing one of the lines is so positioned as to cross the other of the lines, wherein portions of the line from the respective input terminals to cross-points between the lines and the signal line or to a vicinity of the cross-point, are positioned next to each other.

With the above arrangement, in which the signal line crossing the non-inverting-side line crosses the inverting-side line, an interference identical to the interference from the signal line to the non-inverting-side line via the parasite capacitances is given to the inverting-side line from the signal line via the parasite capacitances. Therefore, the interferences cancel out each other as a result of the differential operation of the differential amplifier. Thereby, it is possible to reduce effects of the interferences onto the operation of the switched capacitor circuit.

Additionally, in the switched capacitor circuit, the non-inverting-side switch and the inverting-side switch are switched on/off during signal operation. Thus, a clock signal is required to control the switching-on/off of the respective switches. Therefore, in the switched capacitor circuit, it is preferable that the respective switches and the differential amplifier are distanced from each other.

On the other hand, when the respective switches and the differential amplifier are positioned to be distanced from each other, the non-inverting-side line and the inverting-side line should have a long length. This makes it difficult to have a layout in which each line does not cross any of the signal lines.

Contrary, in the above arrangement, the lines are positioned next to each other, and the signal line crossing one of the lines crosses the other of the lines, thereby preventing the reduction in the operational accuracy of the switched capacitor circuit, which is caused by the interferences from the signal line to the respective lines. Therefore, with the above arrangement, it is possible to prevent the reduction in the operational accuracy due to clock noise, while still having a simple layout.

This can improve the signal operational accuracy, even if capacitors having the same capacitance are used. Moreover, the above-mentioned arrangement requires less capacitance of the capacitors to achieve the same degree of the signal operational accuracy as a conventional arrangement. Therefore, the above-mentioned arrangement can reduce electric power consumption.

Especially, by having an appropriate shape of the cross points and appropriate materials for an insulator between the signal line and the lines, so that the parasite capacitance between the non-inverting-side line and the signal line will be substantially equal to that between the inverting-side and the signal line, it is possible to cause the interferences from the signal line to the lines to be substantially equal to each other, further, to reduce the effects that affect the operation.

In addition to the arrangement described above, it may be so arranged that the non-inverting-side line is connected to a non-inverting-side switch (SW1$p$, SW5$p$, SW11$p$, SW12$p$, SW51$p$, SW52$p$) for resetting the non-inverting input terminal, while a non-inverting-side capacitor (Cfp, Csp, Ccp) is connected to the non-inverting-side line or is formed to be connectable to the non-inverting-side line, while the inverting-side line is connected to an inverting-side switch (SW1$m$, SW5$m$, SW11$m$, SW12$m$, SW51$m$, SW52$m$) for resetting the inverting input terminal, while an inverting-side capacitor (Cfm, Csm, Ccm) is connected to the inverting-side line or is formed to be connectable to the inverting-side line.

When arranged as above, during the operation of the switched capacitor circuit, an output of the switched capacitor circuit is controlled in accordance with the principle of conservation of charge in the non-inverting-side line connected to the non-inverting-side capacitor, and the principle of conservation of charge in the inverting-side line connected to the inverting-side capacitor.

In this case, if the lines were positioned in different directions so that the signal line crosses only one of the lines, the operational accuracy would be reduced because the parasite capacitances between the signal line and the lines only change, from a setting value, an electric charge of an input terminal connected to the one of the lines.

On the other hand, with the above arrangement, in which the signal line crosses both the lines, the parasite capacitances between the signal line and the lines change the electric charges of both the input terminals in the same direction from the setting value. Therefore, the changes in both the electric charges are cancelled out by the differential operation of the differential amplifier, thereby preventing reduction in the operational accuracy due to the parasite capacitances.

This can improve the signal operational accuracy, even if capacitors having the same capacitance are used. Moreover, the above-mentioned arrangement requires less capacitance of the capacitors to achieve the same degree of the signal operational accuracy as a conventional arrangement. Therefore, the above-mentioned arrangement can reduce electric power consumption.

Especially, when the inverting-side capacitor and the non-inverting-side capacitor have the same capacitance, by having an appropriate shape of the cross-points and appropriate materials for an insulator between the signal line and the lines, so that the parasite capacitance between the non-inverting-side line and the signal line will be substantially equal to that between the inverting-side and the signal line, it is possible to cause the shifts in both the electric charges due to the parasite capacitances to be substantially equal to each other, and to prevent the reduction (deterioration) in the operational accuracy. Note that ideally the shifts in the electric charges are desired to be zero.

On the other hand, another suitable switched capacitor circuit (1, 1a, 11, 21, 3, 41, 51) of the present invention, as described above, includes (a) a differential amplifier (AMP1, AMP2), (b) a non-inverting-side switch (SW1p, SW5p, SW11p, SW12p, SW51p, SW52p) and an inverting-side switch (SW1m, SW5m, SW11m, SW12m, SW51m, SW52m), respectively connected to a non-inverting input terminal and an inverting input terminal of the differential amplifier, for resetting the non-inverting input terminal and the inverting input terminal, respectively, (c) a non-inverting-side line (L1p, L2p, L11p, L12p, L21p, L22p) connecting the non-inverting input terminal and the non-inverting-side switch, and (d) an inverting-side line (L1m, L2m, L11m, L12m, L21m, L22m) connecting the inverting input terminal and the inverting-side switch, wherein areas (A31, A32) in which the switches are to be respectively provided are respectively provided on both sides of the differential amplifier, the another switched capacitor circuit having the following arrangements.

Namely, each of the non-inverting-side switch and the inverting-side switch is made of a pair of first and second switches (SW11p, SW11m, SW51p, SW51m; SW12p, SW12m, SW52p, SW52m) connected to each other in parallel. Moreover, in one of the areas, which is a first area (A31), the non-inverting-side first switch and the inverting-side first switch are provided, and in the other of the areas, which is a second area (A32), the non-inverting-side second switch and the inverting-side second switch are provided.

The above arrangement allows the non-inverting-side and the inverting-side first switches to be positioned closer to each other, while also allowing the non-inverting-side and the inverting-side second switches to be positioned closer to each other, compared with the arrangement in which the non-inverting-side switch is provided in one (for example, the first area) of the areas and the inverting-side switch is provided in the other (for example, the second area) of the areas. Therefore, the arrangement improves matching accuracy between the non-inverting-side and inverting-side first switches, so that clock noise that is given to the non-inverting input terminal via the non-inverting-side first switch and the non-inverting-side line will be substantially equal to clock noise that is given to the inverting input terminal via the inverting-side first switch and the inverting-side line. Similarly, the arrangement improves matching accuracy between both the second switches so that the input terminals will be given clock noise substantially equal to each other via the second switches and the lines.

This causes clock noise given to the respective input terminals to cancel each other, thereby reducing the effect of the clock noise on the operation of the switched capacitor circuit, the clock noise being due to the clock signal for driving the respective switches. Moreover, the above-mentioned arrangement requires less capacitance of the capacitors to achieve the same degree of the signal operational accuracy as a conventional arrangement. Therefore, the above-mentioned arrangement can reduce electric power consumption.

Especially, by positioning the first switches to be closer to each other, while positioning the second switches to be closer to each other, it is possible to improve the matching accuracies between the first switches and between the second switches. In addition, by having such arrangement that diffusion areas of the first switches overlap each other, while those of the second switches overlap each other, it is possible to further improve the respective matching accuracies.

Further, in addition to the arrangement described above, it may be so arranged that a signal line (SL1p, SL1m, SL2p, SL2m, SL11p, SL11m, SL12p, SL12m) crossing one of the lines is so positioned as to cross the other of the lines, wherein the lines are positioned next to each other (i) from the respective input terminals to respective cross-points between the signal line and the lines, or (ii) from the respective input terminals to respective vicinities of the cross-points.

With the above arrangement, caused to be substantially equal to each other are the interferences from the signal line to the respective lines via the parasite capacitances between the signal line and the lines. Thereby, the interferences cancel out each other by the differential operation of the differential amplifier. This can further improve the signal operation, even if capacitors having the same capacitance are used. Moreover, the above-mentioned arrangement requires less capacitance of the capacitors to achieve the same degree of the signal operational accuracy as a conventional arrangement. Therefore, the above-mentioned arrangement can reduce electric power consumption.

Moreover, instead of being arranged such that the lines are positioned next to each other, the switched capacitor circuit of the present invention may be so arranged that the non-inverting-side switch and the inverting-side switch are positioned so as to be closer to an area in which the differential amplifier is provided, than are areas (A21, A22) in which capacitors respectively connected to the switches, or to have substantially equal distances from the area in which the differential amplifier is provided, to distances between (i) the area in which the differential amplifier is provided, and (ii) the areas in which capacitors respectively connected to the switches, in the other words, the switched capacitor circuit of the present invention may be so arranged that the non-inverting-side switch and the inverting-side switch are so positioned that respective distances (a) between the differential amplifier and the non-inverting-side switch and (b) between the differential amplifier and the inverting-side switch are less than or substantially equal to respective distances (c) between the differential amplifier AMP1 and an area (A21) in which a capacitor to be connected to the non-inverting-side switch is provided and (d) between the differential amplifier AMP1 and an area (A22) in which a capacitor to be connected to the inverting-side switch is provided.

With the above arrangement, both the switches are provided in the vicinity of the differential amplifier, so that both the lines have a shorter length. Thus, it is possible to reduce, in number, the signal line crossing the lines. This reduces the parasite capacitances between the lines and the substrate and the like, as well as the parasite capacitances due to the crossing of the signal line and the lines. As a result, it is possible to reduce the parasite capacitances generated in the input terminals of the differential amplifier, and to improve settling properties of the switched capacitor circuit. This further improves the switched capacitor circuit in terms of the accuracies and the electric power consumption.

Further, in addition to the respective arrangements, it is preferable to arrange such that the non-inverting-side first switch and the inverting-side second switch be positioned in line symmetry with respect to the differential amplifier, and the inverting-side first switch and the non-inverting-side second switch be positioned in line symmetry with respect to the differential amplifier.

With the above arrangement, in which the respective switches are positioned in line symmetry with respect to the differential amplifier, it is possible to, between the input terminals of the differential amplifier, suppress unevenness between the parasite capacitances due to asymmetrical configuration. This further improves the switched capacitor circuit in terms of the accuracies and the electric power consumption.

Furthermore, in addition to the above arrangement, it is preferable to arrange such that (a) a non-inverting-side line between the non-inverting-side first switch and the non-inverting input terminal and (b) an inverting-side line between the inverting-side second switch and the inverting input terminal are provided in line symmetry with respect to the differential amplifier, while (c) an inverting-side line between the inverting-side first switch and the inverting input terminal and (d) a non-inverting-side line between the non-inverting-side second switch and the non-inverting input terminal are provided in line symmetry with respect to the differential amplifier.

With the above arrangement, in which the lines between the respective switches and the input terminals are also positioned in line symmetry with respect to the differential amplifier, it is possible to, between the input terminals of the differential amplifier, further reduce the unevenness between the parasite capacitances due to the asymmetrical configuration. This further improves the switched capacitor circuit in terms of the accuracies and the electric power consumption.

Moreover, in addition to the respective arrangement described above, it is preferable to arrange such that the non-inverting-side line and the inverting-side line are positioned in line symmetry with respect to a central line between the lines, regardless of whether two each of the non-inverting-side and inverting-side switches are provided to be next to each other.

With the arrangement described above, in which the respective lines are positioned in line symmetry with respect to the central line between the lines, it is possible to, between the input terminals of the differential amplifier, further reduce the unevenness between the parasite capacitances due to the asymmetrical configuration. This further improves the switched capacitor circuit in terms of the accuracies and the electric power consumption.

Especially, with an arrangement in which the lines are positioned in parallel to each other, it is possible to further reduce differences between the parasite capacitances respectively in the input terminals of the differential amplifier. Further, instead of or in addition to the arrangement in which the lines are positioned in parallel to each other, it may be so arranged that the components, such as the first switches, second switches or the like, located in the vicinities of the lines are positioned in line symmetry with respect to the center line between the lines. With this arrangement, it is possible to further reduce the differences between the parasite capacitances respectively in the input terminals of the differential amplifier. This further improves the switched capacitor circuit in terms of the accuracies and the electric power consumption.

On the other hand, yet another suitable switched capacitor circuit (31) of the present invention is provided with (a) a differential amplifier (AMP1), (b) a non-inverting-side switch (SW1$p$) and an inverting-side switch (SW1$m$), respectively connected to a non-inverting input terminal and an inverting input terminal of the differential amplifier, for resetting the non-inverting input terminal and the inverting input terminal, respectively, (c) a non-inverting-side line (L1$p$) connecting the non-inverting input terminal and the non-inverting-side switch, (d) an inverting-side line (L1$m$) connecting the inverting input terminal and the inverting-side switch, a signal line (SL11$p$ and SL12$m$) crossing one of the non-inverting-side line and the inverting-side line, and (e) inverting signal line (SL11$m$ and SL12$p$), crossing the one of the non-inverting-side line and the inverting-side line, for receiving an inverting signal of a signal to be transmitted via the signal line.

With the above arrangement, in which the inverting signal line receives the inverting signal of the signal to be transmitted via the signal line, the effect given from the signal line onto the lines via the parasite capacitance and the effect given from the inverting signal line onto the lines via the parasite capacitance cancel out each other. Therefore, compared with the arrangement in which no inverting signal line is provided, the interferences from the signal line onto the input terminals connected to the lines can be suppressed, thereby reducing the effects of the interferences onto the operation of the switched capacitor circuit. This can improve the signal operation, even if capacitors having the same capacitance are used. Moreover, the above-mentioned arrangement requires less capacitance of the capacitors to achieve the same degree of the signal operational accuracy as a conventional arrangement. Therefore, the above-mentioned arrangement can reduce electric power consumption.

Furthermore, in addition to the respective arrangement, it may be so arranged that (a) areas (A21, A22) in which the capacitors are respectively provided, (b) areas (A31, A32) in which the switches are respectively provided, and (c) areas (A41, A42) in which clock signal lines for supplying a clock signal respectively to the switches are respectively provided, are provided respectively on both sides of an area (A1) in which the differential amplifier is to be provided, in this order from the area in which the differential amplifier is to be provided. With this arrangement, in which the clock signal lines are positioned to be distanced from the differential amplifier, it is possible to suppress the reducing in the operational accuracy due to the clock noise.

Even in case where the non-inverting-side line and the inverting-side line are not directly connected to the non-inverting input terminal and the inverting input terminal of the differential amplifier, the respective lines are connected respectively to the input terminals via the capacitors. Thus, it is possible to suppress the reduction in the operational accuracy, similarly to the arrangement in which the lines are directly connected to the terminals, provided that the switched capacitor circuit carries out the operation in accordance with the principle of conservation of charge in the respective lines.

Specifically, a switched capacitor circuit (51) of the present invention is provided with (i) a differential amplifier (AMP1), (ii) a non-inverting-side line (L2$p$, L21$p$, L22$p$), one end of which is connected to a non-inverting-side first capacitor (Csp, Cfp), and the other end of which is connected to a non-inverting input terminal of the differential amplifier via a non-inverting-side second capacitor (Ccp), (iii) an inverting-side line (L2m, L21m, L22m), one end of which is connected to an inverting-side first capacitor (Csm, Cfm), and the other end of which is connected to an inverting input terminal of the differential amplifier via an inverting-side second capacitor (Ccm), wherein operation is carried out in accordance with the principle of conservation of charge in the both lines, wherein a signal line (SL2p, SL2m) crossing one of the lines is so positioned as to cross the other of the lines, wherein (a) a portion of the non-inverting-side line from an end of the non-inverting-side second capacitor to a cross-point between the non-inverting-side line and the signal line or to a vicinity of the cross-point, and (b) a portion of the inverting-side line from an end of the inverting-side second capacitor to a cross-point between the inverting-side line and the signal line or to a vicinity of the cross-point, are positioned next to each other.

With the above arrangement, in which the signal line crossing the non-inverting-side line crosses the inverting-side line, an interference that is identical to the interference from the signal line onto the non-inverting-side line via the parasite capacitance is given to the inverting-side line from the signal line via the parasite capacitance. Here, the respective lines are connected to the respective input terminals via the non-inverting-side capacitance or via the inverting-side capacitance. Thus, the switched capacitance circuit carries out the operation in accordance with the principle of conservation of charge in the respective lines. Therefore, those interferences cancel each other by the differential operation of the differential amplifier, thereby reducing the effects of the interferences onto the operation of the switched capacitor circuit.

Furthermore, by having the above arrangement in which the respective lines are positioned next to each other, and the signal line crossing the one of the lines crosses the other of the lines, suppressed is the reduction in the operational accuracy of the switched capacitor due to the interferences from the signal line onto the respective lines. Therefore, it is possible to prevent the reduction in the operational accuracy, while still having a simple layout.

This can improve the signal operation, even if capacitors having the same capacitance are used. Moreover, the above-mentioned arrangement requires less capacitance of the capacitors to achieve the same degree of the signal operational accuracy as a conventional arrangement. Therefore, the above-mentioned arrangement can reduce electric power consumption.

Moreover, still another suitable switched capacitor circuit (51) of the present invention, as described above, is provided with (a) a differential amplifier (AMP1), (b) a non-inverting-side line (L2p, L21p, L22p), one end of which is connected to a non-inverting-side first capacitor (Csp, Cfp), and the other end of which is connected to a non-inverting input terminal of the differential amplifier via a non-inverting-side second capacitor (Ccp), (c) an inverting-side line (L2m, L21m, L22m), one end of which is connected to an inverting-side first capacitor (Csm, Cfm), and the other end of which is connected to an inverting input terminal of the differential amplifier via an inverting-side second capacitor (Ccm), (d) a non-inverting-side switch (SW1p, SW5p, SW51p, SW52p, SW61p, SW62p) and an inverting-side switch (SW1m, SW5m, SW51m, SW52m, SW61m, SW62m), respectively connected to a non-inverting input terminal and an inverting input terminal of the differential amplifier, for resetting the non-inverting input terminal and the inverting input terminal, respectively; wherein areas (A31, A32) in which the switches are respectively provided are provided on both sides of the differential amplifier, respectively, wherein each of the non-inverting-side switch and the inverting-side switch is made of a pair of first and second switches (SW51p, SW51m, SW61p, SW61m) (SW52p, SW52m, SW62p, SW62m) connected to each other in parallel, wherein in one of the areas, which is a first area (A31), the non-inverting-side first switch and the inverting-side first switch are provided, and in the other of the areas, which is a second area (A32), the non-inverting-side second switch and the inverting-side second switch are provided.

The above arrangement improves both matching accuracy between the first switches and that between the second switches, similarly to the foregoing arrangement in which the non-inverting-side line and the inverting-side lines are directly connected to the respective input terminals of the differential amplifier. This causes (a) the effect of the clock noise given to the non-inverting-side input terminal via the non-inverting-side second switch, the non-inverting-side line and the non-inverting-side second capacitor, and (b) the effect of the clock noise given to the inverting-side input terminal via the inverting-side second switch, the inverting-side line and the inverting-side second capacitor, to be substantially equal to each other. Because of this, the effects cancel out each other, thereby reducing the effects of the clock noise onto the operation of the switched capacitor circuit, the clock noise being due to the clock signal for driving the respective switches.

This can improve the signal operation, even if capacitors having the same capacitance are used. Moreover, the above-mentioned arrangement requires less capacitance of the capacitors to achieve the same degree of the signal operational accuracy as a conventional arrangement. Therefore, the above-mentioned arrangement can reduce electric power consumption.

Furthermore, in addition to the above arrangement, it is preferable to arrange such that a signal line crossing one of the lines is so positioned as to cross the other of the lines. By arranging as above, the interferences from the signal line onto the respective lines cancel out each other by the differential operation of the differential amplifier. This arrangement can improve the signal operation, even if capacitors having the same capacitance are used. Moreover, the above-mentioned arrangement requires less capacitance of the capacitors to achieve the same degree of the signal operational accuracy as a conventional arrangement. Therefore, the above-mentioned arrangement can reduce electric power consumption.

Furthermore, still yet another switched capacitor circuit (51) of the present invention is, as described above, provided with (a) a differential amplifier (AMP1), (b) a non-inverting-side line (L12p, L21p, L22p), one end of which is connected to a non-inverting-side first capacitor (Csp, Cfp), and the other end of which is connected to a non-inverting input terminal of the differential amplifier via a non-inverting-side second capacitor (Ccp), (c) an inverting-side line (L2m, L21m, L22m), one end of which is connected to an inverting-side first capacitor (Csm, Cfm), and the other end of which is connected to an inverting input terminal of the differential amplifier via an inverting-side second capacitor (Ccm), (d) a signal line (SL11p, SL12p) crossing one of the non-inverting-side line and the inverting-side line, and (e) an inverting signal line (SL11m, SL12m), crossing the one of the non-inverting-side line and the inverting-side line, for receiving an inverting signal of a signal to be transmitted via the signal line.

In the switched capacitor circuit of the above arrangement, operation is carried out in accordance with the principle of conservation of charge in the both lines. Thus, the operational accuracy is reduced by the interferences onto the lines. However, similarly to the foregoing arrangement in which the inverting signal line is provided, the effects from the signal line onto the line via the parasite capacitance and from the inverting signal line onto the line via the parasite capacitance cancel out each other. Therefore, it is possible to suppress the reduction in the operational accuracy due to the interferences. As a result, this can improve the signal operation, even if capacitors having the same capacitance are used. Moreover, the above-mentioned arrangement requires less capacitance of the capacitors to achieve the same degree of the signal operational accuracy as a conventional arrangement. Therefore, the above-mentioned arrangement can reduce electric power consumption.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A switched capacitor circuit, comprising:

a differential amplifier;

a non-inverting-side line connected to a non-inverting input terminal of the differential amplifier; and an inverting-side line connected to an inverting input terminal of the differential amplifier, wherein a signal line crossing one of the lines is so provided as to cross the other of the lines, and wherein the lines are positioned next to each other (i) from the respective input terminals to respective cross-points between the signal line and the respective lines, or (ii) from the respective input terminals to respective vicinities of the cross-points.

2. The switched capacitor circuit as set forth in claim 1, wherein:

the non-inverting-side line is connected to a non-inverting-side switch for resetting the non-inverting input terminal, while a non-inverting-side capacitor is connected to the non-inverting-side line or is formed to be connectable to the non-inverting-side line, and the inverting-side line is connected to an inverting-side switch for resetting the inverting input terminal, while an inverting-side capacitor is connected to the inverting-side line or is formed to be connectable to the inverting-side line.

3. The switched capacitor circuit as set forth in claim 2, wherein:

(a) areas in which the capacitors are respectively provided, (b) areas in which the switches are respectively provided, and (c) areas in which clock signal lines for supplying a clock signal respectively to the switches are respectively provided, are provided respectively on both sides of an area in which the differential amplifier is to be provided, in this order from the area in which the differential amplifier is to be provided.

4. The switched capacitor circuit as set forth in claim 1, wherein:

the non-inverting-side line and the inverting-side line are positioned in line symmetry with respect to a central line between each other.

5. The switched capacitor circuit as set forth in claim 1, further comprising:

guard lines, provided so as to sandwich the non-inverting-side line and the inverting-side line, for receiving a steady potential.

6. A switched capacitor circuit, comprising:

a differential amplifier;

a non-inverting-side switch and an inverting-side switch, respectively connected to a non-inverting input terminal and an inverting input terminal of the differential amplifier, for resetting the non-inverting input terminal and the inverting input terminal, respectively;

a non-inverting-side line connecting the non-inverting input terminal and the non-inverting-side switch; and an inverting-side line connecting the inverting input terminal and the inverting-side switch, wherein areas in which the switches are to be respectively provided are respectively provided on both sides of the differential amplifier, wherein each of the non-inverting-side switch and the inverting-side switch is made of a pair of first and second switches connected to each other in parallel, and wherein in one of the areas, which is a first area, the non-inverting-side first switch and the inverting-side first switch are provided, and in the other of the areas, which is a second area, the non-inverting-side second switch and the inverting-side second switch are provided.

7. The switched capacitor circuit as set forth in claim 6, wherein:

a signal line crossing one of the lines is so positioned as to cross the other of the lines, wherein the respective lines are positioned next to each other (i) from the respective input terminals to respective cross-points between the signal line and the lines, or (ii) from the respective input terminals to respective vicinities of the cross-points.

8. The switched capacitor circuit as set forth in claim 6, wherein:

the non-inverting-side switch and the inverting-side switch are so positioned that respective distances (a) between the differential amplifier and the non-inverting-side switch and (b) between the differential amplifier and the inverting-side switch are less than or substantially equal to respective distances (c) between the differential amplifier and an area in which a capacitor to be connected to the non-inverting-side switch is provided and (d) between the differential amplifier and an area in which a capacitor to be connected to the inverting-side switch is provided.

9. The switched capacitor circuit as set forth in claim 6, wherein:

the non-inverting-side first switch and the inverting-side second switch are positioned in line symmetry with respect to the differential amplifier, and the inverting-side first switch and the non-inverting-side second switch are positioned in line symmetry with respect to the differential amplifier.

10. The switched capacitor circuit as set forth in claim 9, wherein:

(a) the non-inverting-side line between the non-inverting-side first switch and the non-inverting input terminal and (b) the inverting-side line between the inverting-side second switch and the inverting input terminal are provided in line symmetry with respect to the differential amplifier, and (c) the inverting-side line between the inverting-side first switch and the inverting input terminal and (d) the non-inverting-side line between the non-inverting-side second switch and the non-inverting input terminal are provided in line symmetry with respect to the differential amplifier.

11. The switched capacitor circuit as set forth in claim 6, wherein:

the non-inverting-side line and the inverting-side line are positioned in line symmetry with respect to a central line between the lines.

12. The switched capacitor circuit as set forth in claim 6, wherein:

(a) areas in which the capacitors are respectively provided, (b) areas in which the switches are respectively provided, and (c) areas in which clock signal lines for supplying a clock signal respectively to the switches are respectively provided, are provided respectively on both sides of an area in which the differential amplifier is to be provided, in this order from the area in which the differential amplifier is to be provided.

13. The switched capacitor circuit as set forth in claim 6, further comprising:

guard lines, provided so as to sandwich the non-inverting-side line and the inverting-side line, for receiving a steady potential.

* * * * *